United States Patent
Iijima et al.

(10) Patent No.: US 6,828,669 B2
(45) Date of Patent: Dec. 7, 2004

(54) INTERCONNECTION SUBSTRATE HAVING METAL COLUMNS COVERED BY A RESIN FILM, AND MANUFACTURING METHOD THEREOF

(75) Inventors: Takahiro Iijima, Nagano (JP); Shinichi Wakabayashi, Nagano (JP); Yuichi Matsuda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/736,864

(22) Filed: Dec. 14, 2000

(65) Prior Publication Data

US 2001/0008309 A1 Jul. 19, 2001

(30) Foreign Application Priority Data

Jan. 13, 2000 (JP) ........................................ 2000-004873

(51) Int. Cl.[7] .............................................. H01L 23/12
(52) U.S. Cl. ..................... 257/700; 257/673; 257/690; 257/700; 257/758; 257/737; 438/613; 438/629; 438/637; 438/639; 438/640; 361/760; 361/784; 361/792; 361/794; 174/250; 174/260; 428/901; 29/830
(58) Field of Search ................................. 257/737, 690, 257/700, 738, 774, 776, 779, 780, 782, 784; 438/613, 629, 637, 639, 640, 667, 700, 713, 701; 29/830; 428/901; 174/250, 260; 361/760, 784, 792, 794

(56) References Cited

U.S. PATENT DOCUMENTS

| | | | | |
|---|---|---|---|---|
| 4,172,907 A | * | 10/1979 | Mones et al. | 438/759 |
| 4,816,323 A | * | 3/1989 | Inoue | 428/210 |
| 5,373,191 A | * | 12/1994 | Usagawa et al. | 257/773 |
| 5,534,666 A | * | 7/1996 | Ishida | 174/260 |
| 5,906,042 A | * | 5/1999 | Lan et al. | 29/852 |
| 5,907,786 A | * | 5/1999 | Shinomiya | 438/614 |
| 5,914,274 A | * | 6/1999 | Yamaguchi et al. | 438/690 |
| 6,211,561 B1 | * | 4/2001 | Zhao | 257/522 |
| 6,281,445 B1 | * | 8/2001 | Yokoyama | 174/250 |
| 6,307,161 B1 | * | 10/2001 | Grube et al. | 174/260 |

FOREIGN PATENT DOCUMENTS

| | | | | |
|---|---|---|---|---|
| JP | 6379330 | | 4/1988 | |
| JP | 01318248 A | * | 12/1989 | |
| JP | 05335475 A | * | 12/1993 | ......... H01L/23/538 |
| JP | 10069961 A | * | 3/1998 | |

\* cited by examiner

Primary Examiner—Bradley Baumeister
Assistant Examiner—Chris C. Chu
(74) Attorney, Agent, or Firm—Ladas & Parry

(57) ABSTRACT

An interconnection substrate comprises an uppermost interconnection layer having a plurality of terminal pads located at positions corresponding to a plurality of solder bumps (external connection terminals) provided on a semiconductor element which is to be mounted on the interconnection substrate. The interconnection substrate also has a metal column formed on each of the terminal pads and has a resin film covering a side surface of the metal column. The interconnection substrate further has an insulating layer formed on the uppermost interconnection layer so that a gap is formed between the insulating layer and an outer peripheral surface of the resin film.

3 Claims, 17 Drawing Sheets

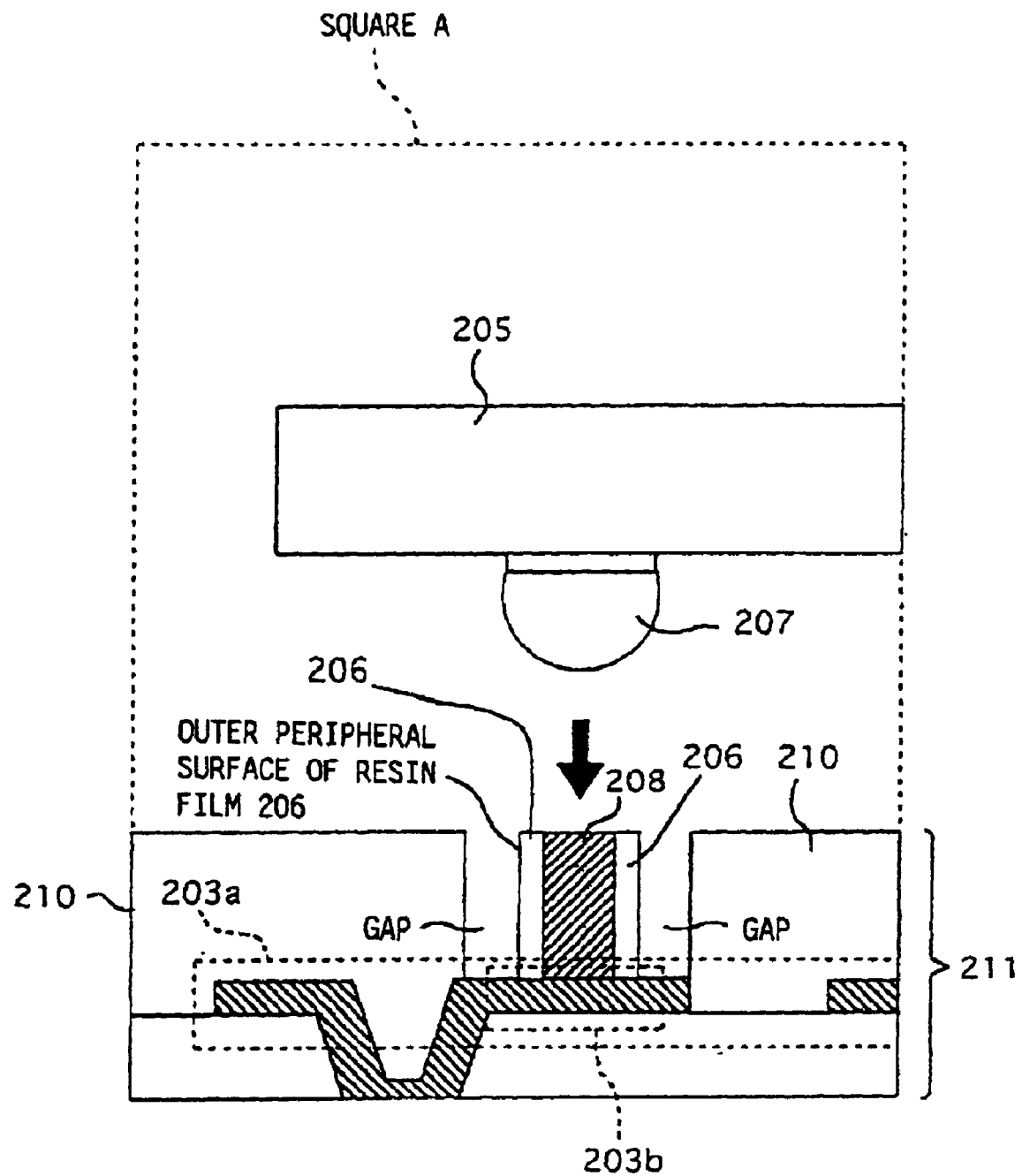

INTERCONNECTION SUBSTRATE HAVING METAL COLUMNS COVERED BY A RESIN FILM, AND MANUFACTURING METHOD THEREOF

BACKGROUND OF THE INVENTION

1. Field of the Invention

The present invention generally relates to an interconnection substrate and a manufacturing method thereof and, more particularly, to an interconnection substrate and a manufacturing method thereof which are useful in reducing stress that occurs between the interconnection substrate and a semiconductor element mounted thereon.

2. Description of the Related Art

Recently, as electronic machines have shrunk in size, semiconductor devices mounted thereon have also been miniaturized. One of these miniaturized semiconductor devices is a CSP (Chip-Size Package). The CSP (hereinafter referred to as semiconductor package) is a multilayer interconnection substrate on which semiconductor elements such as an LSI chip are directly mounted by solder bumps or pins.

FIG. 1A is a cross-sectional view of the conventional semiconductor package. FIG. 1A shows a multilayer interconnection substrate 101 and a semiconductor element 105 to be mounted thereon. As shown in the figure, the semiconductor element 105 has electrodes 107. Each of the electrodes 107 has a column 106 composed of conductive metals. The column 106 has a solder bump 104 on its end. A resin layer 103 protects water penetrating to the semiconductor element 105.

The multilayer interconnection substrate 101 has terminal pads 102 in its uppermost layer. The above-mentioned semiconductor element 105 is then mounted on the multilayer interconnection substrate 101 so that the solder bump 104 is welded to each of the terminal pads 102 with pressure. Thereafter, by reflowing the solder bump 104, the semiconductor element 105 is electrically and mechanically connected to the multilayer interconnection substrate 101. FIG. 1B is a cross-sectional view of the multilayer interconnection substrate 101 and the semiconductor element 105 mounted thereon in the above-mentioned manner.

Generally, the multilayer interconnection substrate 101 and the semiconductor element 105 have different coefficients of thermal expansion. Thus, the multilayer interconnection substrate 101 and the semiconductor element 105 undergo different amounts of thermal contraction during cooling down after the reflowing of the solder bump 104. Two arrows in FIG. 1B indicate the amounts and directions of the thermal contraction which the multilayer interconnection substrate 101 and the semiconductor element 105 undergo.

The above-mentioned column 106 relaxes stress which is caused by the different amounts of thermal contraction of the multilayer interconnection substrate 101 and the semiconductor element 105 and acts therebetween. A description will be given, with reference to FIG. 2, of this point.

FIG. 2A is a cross-sectional view of the column 106 immediately after mounting the semiconductor element 105 and reflowing the solder bump 104. At this point, the whole body is still at a high temperature, and the multilayer interconnection substrate 101 and the semiconductor element 105 have not started thermal contraction yet.

FIG. 2B is a cross-sectional view of the column 106 quite a long time after mounting the semiconductor element 105 and reflowing the solder bump 104. In this figure, the multilayer interconnection substrate 101 and the semiconductor element 105 have undergone thermal contraction. The different amounts of thermal contraction of the multilayer interconnection substrate 101 and the semiconductor element 105 have resulted in stress, which has made the column 106 inclined, as shown in FIG. 2B.

The inclining metal column 106 relaxes the stress which acts on the solder bump 104. Therefore, this prevents the stress from separating the solder bump 104 from the terminal pad 102 provided on the multilayer interconnection substrate 101. This also prevents the stress from acting on and cracking the semiconductor element 105.

The above-mentioned column 106 is formed on the semiconductor element 105 in a post-process thereof, that is, after a pre-process of manufacturing the semiconductor element 105.

However, forming the column 106 in the post-process prolongs the duration of the post-process to that extent. This increases the possibility of the semiconductor element 105, which is completed in itself in the pre-process, falling inferior in the prolonged post-process and, thus, decreases the yield rate of the costly semiconductor elements.

SUMMARY OF THE INVENTION

It is a general object of the present invention to provide an improved and useful interconnection substrate and a manufacturing method thereof in which the above-mentioned problems are eliminated.

A more specific object of the present invention is to provide an interconnection substrate having metal columns covered by a resin film and a manufacturing method thereof which can relax stress, caused originally by different coefficients of thermal expansion between a multilayer interconnection substrate or the interconnection substrate and the semiconductor element mounted thereon, not on the side of the semiconductor element, but on the side of the substrate.

In order to achieve the above-mentioned objects, there is provided according to one aspect of the present invention a multilayer interconnection substrate comprising:

an uppermost interconnection layer having a plurality of terminal pads formed at positions corresponding to a plurality of external connection terminals provided on a semiconductor element which is to be mounted on the multilayer interconnection substrate;

a metal column formed on each of the terminal pads;

a resin film covering a side surface of the metal column; and an insulating layer formed on the uppermost interconnection layer so that a gap is formed between the insulating layer and an outer peripheral surface of the resin film.

Additionally, in the present invention, a height of the metal column may be smaller than a thickness of the insulating layer.

In order to achieve the above-mentioned objects, there is also provided according to another aspect of the present invention a multilayer interconnection substrate manufacturing method comprising the steps of:

forming a plurality of terminal pads in an uppermost interconnection layer;

forming an insulating layer on the uppermost interconnection layer;

forming openings in the insulating layer, the openings located at positions corresponding to the terminal pads;

filling each of the openings with metal particles;

forming a metal column in each of the openings by heating the metal particles at a temperature which melts the metal particles; and removing a part of the insulating layer near but not adjacent to a peripheral side of the metal column, while leaving a part of the insulating layer adjacent to the peripheral side of the metal column, so that a gap is formed around but not adjacent to the peripheral side of the metal column.

Additionally, in the present invention, the step of filling may include a step of filling each of the openings with the metal particles up to a predetermined level in the middle of each of the openings.

In order to achieve the above-mentioned objects, there is also provided according to still another aspect of the present invention a multilayer interconnection substrate manufacturing method comprising the steps of:

forming a plurality of terminal pads in an uppermost interconnection layer;

forming an insulating layer on the uppermost interconnection layer;

forming openings in the insulating layer, the openings located at positions corresponding to the terminal pads;

forming a conductive layer on surfaces of the insulating layer and inner surfaces of the openings;

forming a plating metal on the conductive layer by electrolytic plating by using the conductive layer as an electric supply layer so that the plating metal fills the openings;

forming a metal column in each of the openings by removing other parts of the conductive layer and the plating metal than a part formed in each of the openings by one of etching and polishing so that the conductive layer and the plating metal together form the metal column; and removing a part of the insulating layer near but not adjacent to a peripheral side of the metal column, while leaving a part of the insulating layer adjacent to the peripheral side of the metal column, so that a gap is formed around but not adjacent to the peripheral side of the metal column.

In order to achieve the above-mentioned objects, there is further provided according to still another aspect of the present invention a multilayer interconnection substrate manufacturing method comprising the steps of:

forming a plurality of terminal pads in an uppermost interconnection layer;

forming a conductive layer on the terminal pads;

forming a plating resist on the conductive layer;

forming openings in the plating resist, the openings located at positions corresponding to the terminal pads, so as to expose a part of the conductive layer formed on each of the terminal pads at the bottom of each of the openings;

forming plating metals on the part of the conductive layer exposed at the bottom of each of the openings by electrolytic plating by using the conductive layer as an electric supply layer so that the plating metals form a metal column in each of the openings;

removing the plating resist so as to expose parts of the conductive layer other than a part where the metal column is formed;

removing the exposed parts of the conductive layer other than the part where the metal column is formed by etching;

forming an insulating layer all over the uppermost interconnection layer, leaving an upper surface of the metal column uncovered; and removing a part of the insulating layer near but not adjacent to a peripheral side of the metal column, while leaving a part of the insulating layer adjacent to the peripheral side of the metal column, so that a gap is formed around but not adjacent to the peripheral side of the metal column.

Additionally, in the present invention, the conductive layer may be composed of a metal containing copper, the metal column may be composed of solder, and the step of removing the exposed parts of the conductive layer may be performed using an etching solution, an etching rate of the etching solution with respect to copper being higher than an etching rate of the etching solution with respect to solder.

The multilayer interconnection substrate according to the present invention has the uppermost interconnection layer having a plurality of the terminal pads and the metal column formed on each of the terminal pads. The resin film covers the side surface of the metal column. The insulating layer is formed on the uppermost interconnection layer so that a gap is formed between the insulating layer and the outer peripheral surface of the resin film.

The above-mentioned metal column is formed so as to correspond to each of solder bumps (external connection terminals) provided on a semiconductor element which is to be mounted on the multilayer interconnection substrate. The metal column is to be electrically connected to each of the solder bumps.

According to the multilayer interconnection substrate having this structure, the metal column relaxes stress caused between the multilayer interconnection substrate and the semiconductor element mounted thereon. That is, the metal column can be inclined to relax the stress caused originally by different coefficients of thermal expansion between the multilayer interconnection substrate and the semiconductor element mounted thereon.

Additionally, in reflowing the solder bumps, covering the side of the metal column with the resin film prevents the melted solder from flowing down the outer peripheral surface of the resin film. That is, the upper surfaces of the resin film and the metal column have different affinities to the melted solder, and thus the melted solder does not spread over the upper surface of the resin film, let alone flow down the outer peripheral surface of the resin film.

It should be noted that the height of the metal column may be smaller than the thickness of the insulating layer. Forming the metal column in this manner eases registration of the semiconductor element and the multilayer interconnection substrate when mounting the semiconductor element onto the multilayer interconnection substrate, compared with a case where the height of the metal column is not smaller than the thickness of the insulating layer.

That is, if the center of each of the solder bumps formed on the semiconductor element and the center of the corresponding metal column are not accurately aligned, in the course of bringing the semiconductor element nearer to the multilayer interconnection substrate, the solder bump contacts a periphery of the insulating layer around the metal column. Then, the whole semiconductor element is automatically guided so that each of the solder bumps is also guided toward the upper surface of the corresponding metal column, and eventually, each of the solder bumps adjoins the upper surface of the metal column.

Therefore, there is no need to accurately align the center of each of the solder bumps and the center of the corresponding metal column when mounting the semiconductor element onto the multilayer interconnection substrate.

Further, the metal column is formed not on the semiconductor element, as a conventional column, but on the multilayer interconnection substrate. Therefore, a post-process of manufacturing the semiconductor element does not need to be prolonged to form the metal column. This shortens the duration of the post-process of manufacturing the semiconductor element and thus reduces the possibility of the semiconductor element falling inferior in the post-process, compared with a case of the conventional column formed on a semiconductor element.

In order to achieve the above-mentioned objects, there is also provided according to another aspect of the present invention an interconnection substrate comprising:

an insulating base having a plurality of penetration holes;

a plating metal filling each of the penetration holes;

a terminal pad formed on an end of each of the penetration holes so that the terminal pad is connected to the plating metal, the terminal pad located at a position corresponding to a respective one of a plurality of external connection terminals provided on a semiconductor element which is to be mounted on the interconnection substrate;

a metal column formed on the terminal pad;

a resin film covering a side surface of the metal column; and an insulating layer formed on a surface of the insulating base on the same side as the above-mentioned end of each of the penetration holes so that a gap is formed between the insulating layer and an outer peripheral surface of the resin film.

In order to achieve the above-mentioned objects, there is also provided according to still another aspect of the present invention an interconnection substrate manufacturing method comprising the steps of:

forming an insulating base having a plurality of penetration holes therein and a conductive layer for terminal pads formed on one surface thereof;

forming a plating resist on the conductive layer for terminal pads;

forming openings in the plating resist, the openings located at positions corresponding to each of the penetration holes, so as to expose a part of the conductive layer for terminal pads at the bottom of each of the openings;

filling the penetration holes and the openings respectively with plating metals by electrolytic plating by using the conductive layer for terminal pads as an electric supply layer so that the plating metals form a metal column in each of the openings;

removing the plating resist so as to expose parts of the conductive layer for terminal pads other than a part where the metal column is formed;

removing the exposed parts of the conductive layer for terminal pads other than the part where the metal column is formed by etching so as to expose a surface of the insulating base, leaving the part where the metal column is formed as a terminal pad;

forming an insulating layer on the exposed surface of the insulating base, leaving an upper surface of the metal column uncovered; and removing a part of the insulating layer near but not adjacent to a peripheral side of the metal column, while leaving a part of the insulating layer adjacent to the peripheral side of the metal column, so that a gap is formed around but not adjacent to the peripheral side of the metal column.

Additionally, in the present invention, the conductive layer for terminal pads may be composed of a metal containing copper, the metal column may be composed of solder, and the step of removing the exposed parts of the conductive layer for terminal pads may be performed using an etching solution, an etching rate of the etching solution with respect to copper being higher than an etching rate of the etching solution with respect to solder.

The interconnection substrate according to the present invention provides the same functions as the above-mentioned multilayer interconnection substrate according to the present invention.

The interconnection substrate has a plurality of the penetration holes (via holes) and the plating metals filling the penetration holes. On the one end of each of the penetration holes is formed the terminal pad so as to be connected to each of the plating metals. On the terminal pad is formed the metal column. The resin film covers the side surface of the metal column. The insulating layer is formed on the surface of the insulating base, on the same side as the one end of each of the penetration holes.

There is the gap between the outer peripheral surface of the resin film and the insulating layer. The metal column is formed so as to be located at a position corresponding to a respective one of a plurality of solder bumps (external connection terminals) provided on a semiconductor element which is to be mounted on the interconnection substrate. The metal column is to be electrically connected to each of the solder bumps.

The metal column, the resin film and the insulating layer provided for the interconnection substrate according to the present invention have the same functions as the metal column, the resin film and the insulating layer provided for the above-mentioned multilayer interconnection substrate according to the present invention, respectively. Thus, the metal column, the resin film and the insulating layer provided for the interconnection substrate according to the present invention give the same effects as the metal column, the resin film and the insulating layer provided for the above-mentioned multilayer interconnection substrate according to the present invention, respectively.

Other objects, features and advantages of the present invention will become more apparent from the following detailed description when read in conjunction with the accompanying drawings.

BRIEF DESCRIPTION OF THE DRAWINGS

FIG. 4 is an enlarged cross-sectional view of a dotted-lined square A in FIG. 3;

DETAILED DESCRIPTION OF THE PREFERRED EMBODIMENTS

A description will now be given, with reference to FIG. 3 to FIG. 7, of a multilayer interconnection substrate according to a first embodiment of the present invention.

Figure 1A:
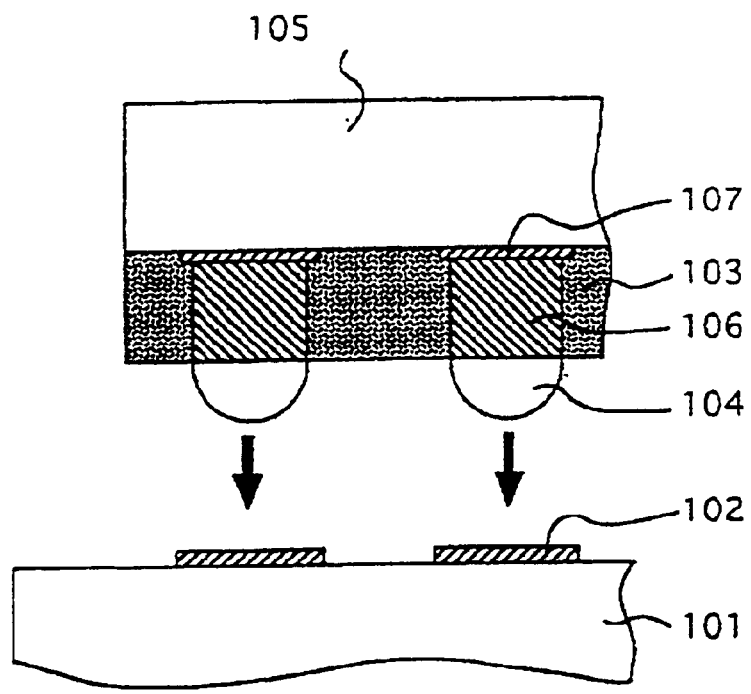
FIG. 1A is a cross-sectional view of a multilayer interconnection substrate and a semiconductor element to be mounted thereon of a conventional semiconductor package.
Figure 1B:
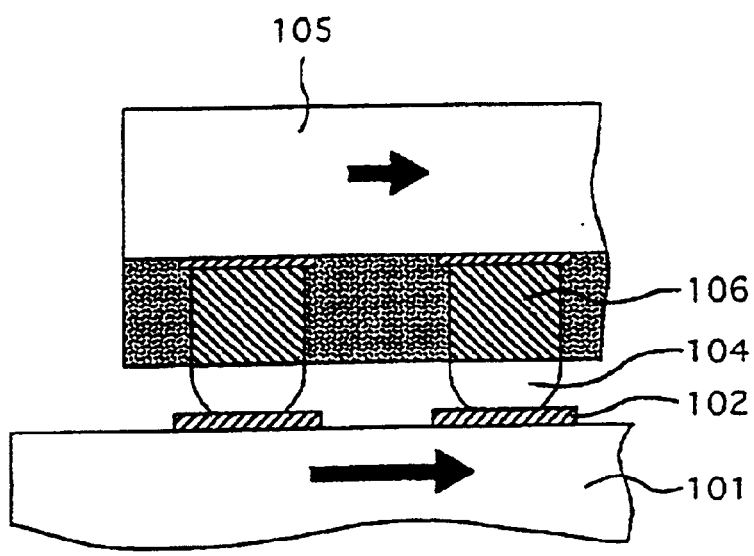
FIG. 1B is a cross-sectional view of the multilayer interconnection substrate and the semiconductor element mounted thereon of the conventional semiconductor package.
Figure 2A:
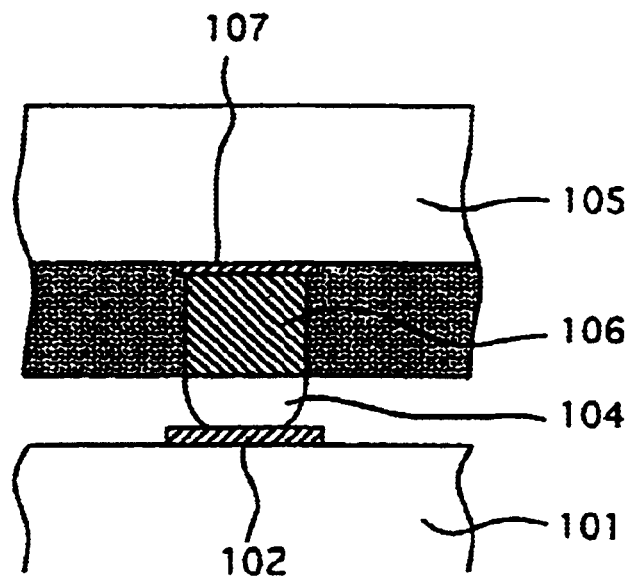
FIG. 2A is a cross-sectional view of a conventional column provided for the semiconductor element immediately after mounting the semiconductor element and reflowing a solder bump.
Figure 2B:
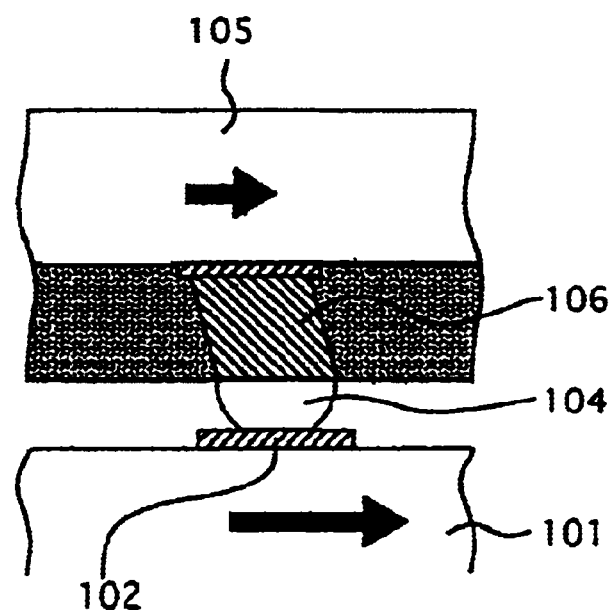
FIG. 2B is a cross-sectional view of the conventional column provided for the semiconductor element quite a long time after mounting the semiconductor element and reflowing the solder bump.
Figure 3:
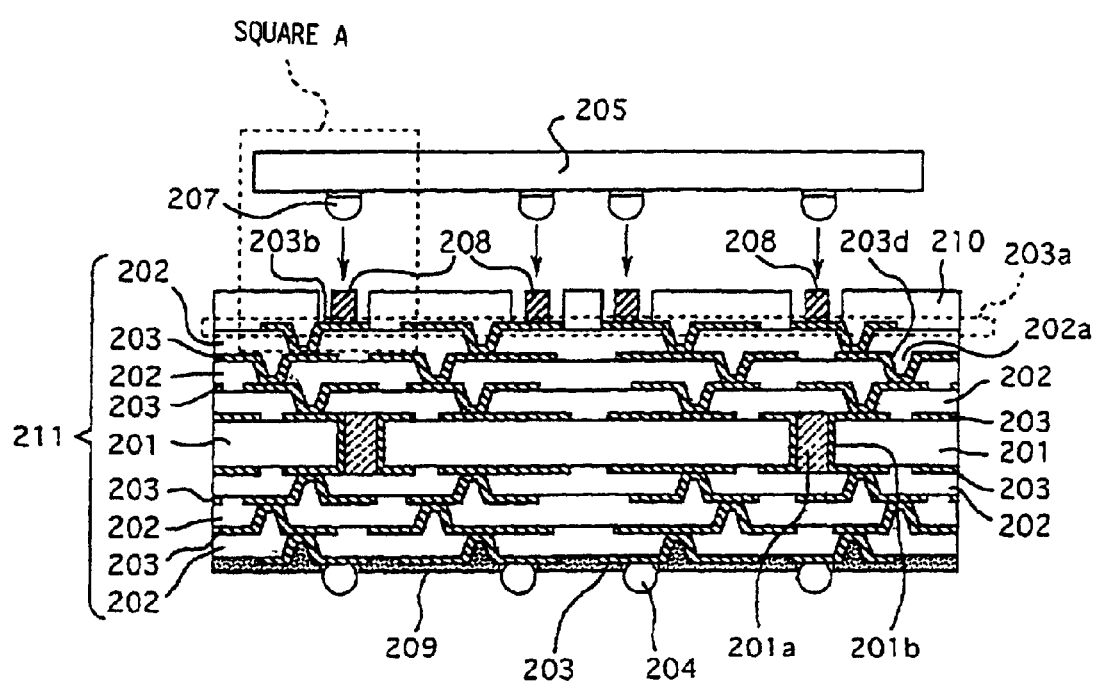
FIG. 3 is a cross-sectional view of a multilayer interconnection substrate according to a first embodiment of the present invention.

FIG. 3 is a cross-sectional view of the multilayer interconnection substrate according to the first embodiment of the present invention.

FIG. 3 shows a core substrate 201, such as a ceramic substrate or a glass epoxy substrate. On both surfaces of the core substrate 201 are formed interconnection layers 203 by patterning copper plating films or copper foils provided thereon. Through holes 201a penetrate the core substrate 201. A through-hole copper plating film 201b is formed on the inner wall of each of the through holes 201a and electrically connects the interconnection layers 203 formed on both surfaces of the core substrate 201.

On the surface of each of the interconnection layers 203 is an insulating interlayer 202 composed of such materials as a photosensitive polyimide resin, a non-photosensitive polyimide resin and an epoxy resin. The insulating interlayer 202 electrically insulates the interconnection layers 203 formed on both surfaces of the insulating interlayer 202. The insulating interlayer 202 has via holes 202a. An interconnection copper plating film 203d is formed on the inner wall of each of the via holes 202a and electrically connects the interconnection layers 203 formed on both surfaces of the insulating interlayer 202.

On both surfaces of the core substrate 201 are formed the interconnection layers 203 and the insulating interlayers 202 alternately. In FIG. 3, there are formed six each of interconnection layers 203 and insulating interlayers 202. 203a is the uppermost interconnection layer of the interconnection layers 203. Further, on the uppermost interconnection layer 203a is an insulating layer 210 composed of such materials as an epoxy resin, a photosensitive polyimide resin, a non-photosensitive polyimide resin, a bismaleimide triazine resin and a polyphenylene ether resin. Metal columns 208 are covered respectively with a resin film (not shown in FIG. 3) on the side and will be described later.

A multilayer interconnection substrate 211 according to the first embodiment of the present invention comprises the core substrate 201, the insulating interlayers 202, the interconnection layers 203 (including the uppermost interconnection layer 203a where terminal pads 203b are formed), the insulating layer 210 and the metal columns 208 covered respectively with a resin film on the side. Solder bumps 204 electrically and mechanically connect the multilayer interconnection substrate 211 and a motherboard (not shown in the figures). When reflowing the solder bumps 204, a solder resist 209 prevents the melted solder from spreading beyond predetermined parts on the surface of the multilayer interconnection substrate 211.

Further, a semiconductor element 205 is mounted on the multilayer interconnection substrate 211 via solder bumps 207 (external connection terminals). The multilayer interconnection substrate 211 and the semiconductor element 205, combined together, make a semiconductor package of the BGA (Ball-Grid-Array) type. It should be noted that the present invention is not only applicable to the semiconductor package of the BGA type but also provides the same functions and effects as described below for a semiconductor package of the PGA (Pin-Grid-Array) type having pins in place of the solder bumps 204.

Here, a description will be given, with reference to FIG. 4, of detailed structures of the uppermost interconnection layer 203a and the insulating layer 210. FIG. 4 is an enlarged cross-sectional view of a dotted-lined square A in FIG. 3.

As shown in FIG. 4, the uppermost interconnection layer 203a has the terminal pads 203b corresponding to each of the solder bumps 207 (external connection terminals) of the semiconductor element 205.

On the surface of each of the terminal pads 203b is formed a metal column 208 composed of such metals as copper and solder. The metal column 208 is covered with a resin film 206 on the side. The resin film 206 is composed of the same materials as the above-mentioned insulating layer 210, such as an epoxy resin, a bismaleimide triazine resin and a polyphenylene ether resin. The insulating layer 210 is formed on the uppermost interconnection layer 203a with a gap to the outer peripheral surface of the resin film 206.

As the metal column 208 is formed on the surface of each of the terminal pads 203b which are formed at positions corresponding to the solder bumps 207 (external connection terminals) of the semiconductor element 205, a plurality of the metal columns 208 are also formed at positions corresponding respectively to the solder bumps 207.

Then, each of the solder bumps 207 of the semiconductor element 205 is welded to the upper surface of the corresponding metal column 208 with pressure. Thereafter, by reflowing the solder bumps 207 and then cooling the whole body to room temperature, the metal columns 208 are electrically and mechanically connected to the corresponding solder bumps respectively.

At this point, as described in the Description of the Related Art, the multilayer interconnection substrate 211 and the semiconductor element 205 have different coefficients of thermal expansion. Thus, the multilayer interconnection substrate 211 and the semiconductor element 205 undergo different amounts of thermal contraction during the cooling of the whole body after the reflowing of the solder bumps 207. The different amounts of thermal contraction result in stress, which acts between the multilayer interconnection substrate 211 and the semiconductor element 205.

Figure 5A:
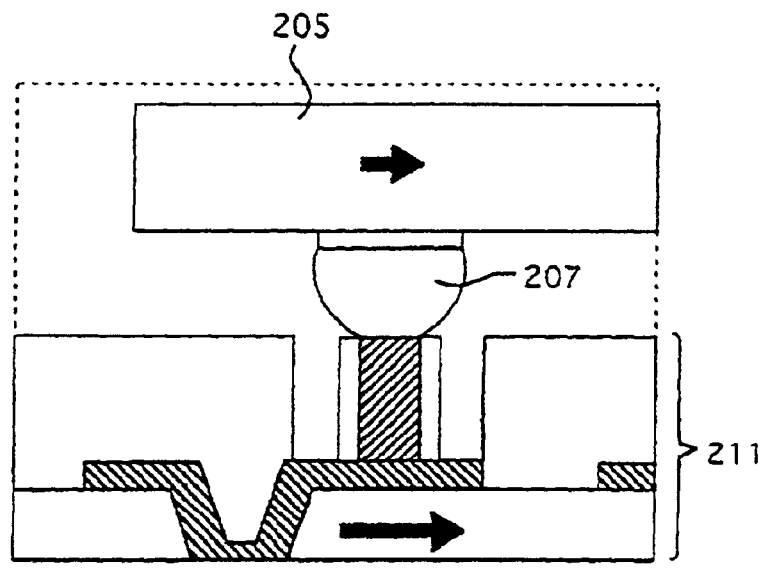
FIG. 5A is an enlarged cross-sectional view of the dotted-lined square A in FIG. 3 immediately after mounting a semiconductor element and reflowing a solder bump.
Figure 5B:
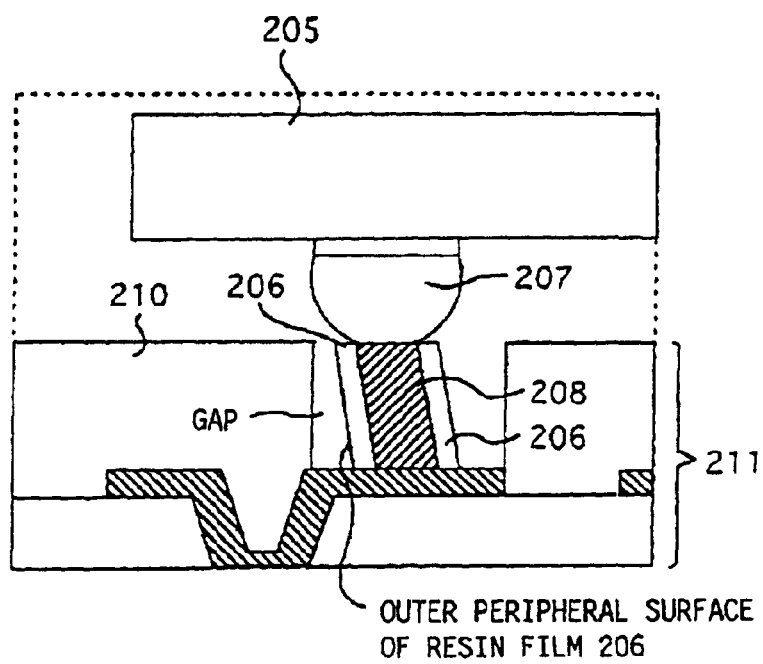
FIG. 5B is an enlarged cross-sectional view of the dotted-lined square A in FIG. 3 quite a long time after mounting the semiconductor element and reflowing the solder bump.

The above-mentioned metal columns 208 relax this stress. A description will be given, with reference to FIG. 5A and FIG. 5B, of this point. FIG. 5A and FIG. 5B are enlarged cross-sectional views of the dotted-lined square A in FIG. 3 after mounting the semiconductor element 205.

FIG. 5A is an enlarged cross-sectional view of the dotted-lined square A in FIG. 3 immediately after mounting the semiconductor element 205 and reflowing the solder bump 207. At this point, the whole body is still at a high temperature, and the multilayer interconnection substrate 211 and the semiconductor element 205 have not started undergoing thermal contraction yet. After a while, the whole body cools down and the multilayer interconnection substrate 211 and the semiconductor element 205 undergo thermal contraction in directions indicated by solid-lined arrows in FIG. 5A. It should be noted that the sizes of these solid-lined arrows symbolically indicate the amounts of the thermal contraction of the multilayer interconnection substrate 211 and the semiconductor element 205.

FIG. 5B is an enlarged cross-sectional view of the dotted-lined square A in FIG. 3 quite a long time after mounting the semiconductor element and reflowing the solder bump 207. In this figure, the whole body has cooled down and the multilayer interconnection substrate 211 and the semiconductor element 205 have undergone thermal contraction. The different amounts of thermal contraction of the multilayer interconnection substrate 211 and the semiconductor element 205 have resulted in stress, which has made the metal column 208 inclined.

The inclining metal column 208 prevents the stress caused by the different amounts of thermal contraction of the multilayer interconnection substrate 211 and the semiconductor element 205 from acting directly on the solder bump 207. This prevents poor connection between the multilayer interconnection substrate 211 and the semiconductor element 205 caused by the separation of the solder bump 207 from the multilayer interconnection substrate 211. This also prevents the semiconductor element 205 from being cracked.

It should be noted that the above-mentioned metal column 208 is not able to incline or change its shape without a gap between the resin film 206 covering the metal column 208 and the insulating layer 210. Therefore, it is preferred that there is an enough gap between the outer peripheral surface of the resin film 206 and the insulating layer 210 for the metal column 208 to change its shape therein in a predetermined manner.

Additionally, the metal column 208 is formed not on the semiconductor element 205, as a conventional column, but on the multilayer interconnection substrate 211. Therefore, a post-process of manufacturing the semiconductor element 205 does not need to be prolonged to form metal columns. This reduces the possibility of the semiconductor element 205 falling inferior in the post-process, compared with the conventional column formed on a semiconductor element.

On the side of the metal column 208 is formed the above-mentioned resin film 206. In reflowing the solder bump 207, this resin film 206 keeps the melted solder from flowing down the outer peripheral surface of the resin film 206.

Figure 6:
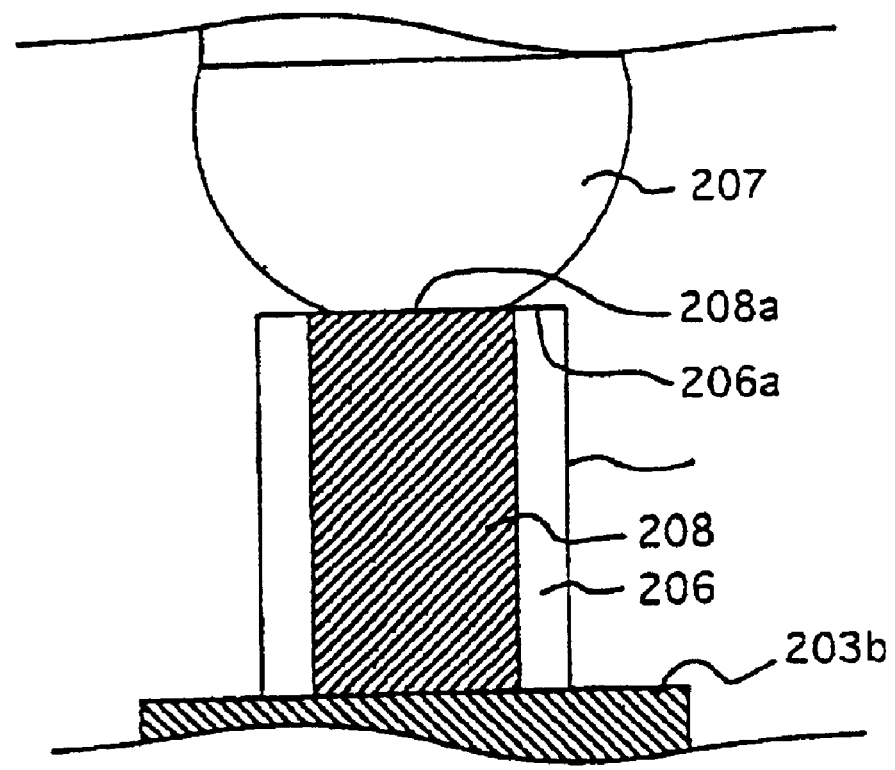
FIG. 6 is an enlarged cross-sectional view of a metal column provided for the multilayer interconnection substrate according to the first embodiment of the present invention.

A description will be given, with reference to FIG. 6, of this point. FIG. 6 is an enlarged cross-sectional view of the metal column 208. In FIG. 6, 206a is the upper surface of the resin film 206, and 208a is the upper surface of the metal column 208.

As mentioned above, the metal column 208 is composed of such metals as copper and solder, and, on the other hand, the resin film 206 is composed of such resins as an epoxy resin, a bismaleimide triazine resin and a polyphenylene ether resin. That is, the upper surface 208a of the metal column 208 and the upper surface 206a of the resin film 206 are formed of different materials. Thus, these upper surfaces have different physical properties and different affinities to the melted solder. Therefore, when reflowing the solder bump 207 on the upper surface 208a of the metal column 208, the melted solder does not spread over the upper surface 206a of the resin film 206, let alone flow down the outer peripheral surface of the resin film 206.

This prevents the melted solder from filling up the gap (shown in FIG. 4) between the outer peripheral surface of the resin film 206 and the insulating layer 210. Also, because the solder does not flow down, there is no need of unnecessarily increasing the amount of solder, and the solder bump 207 does not have to be made unnecessarily large.

Additionally, as shown in FIG. 4, the insulating layer 210 surrounds the metal column 208 with the gap in between, and thus prevents an external force in a horizontal direction from directly pressing the metal column 208. Therefore, when mounting the semiconductor element 205 onto the multilayer interconnection substrate 211, the metal column 208 is kept from coming off pressed by the external force in a horizontal direction.

It should be noted that the height of the metal column 208 may be smaller than the thickness of the insulating layer 210. A description will be given, with reference to FIG. 7A, of this point.

Figure 7A:
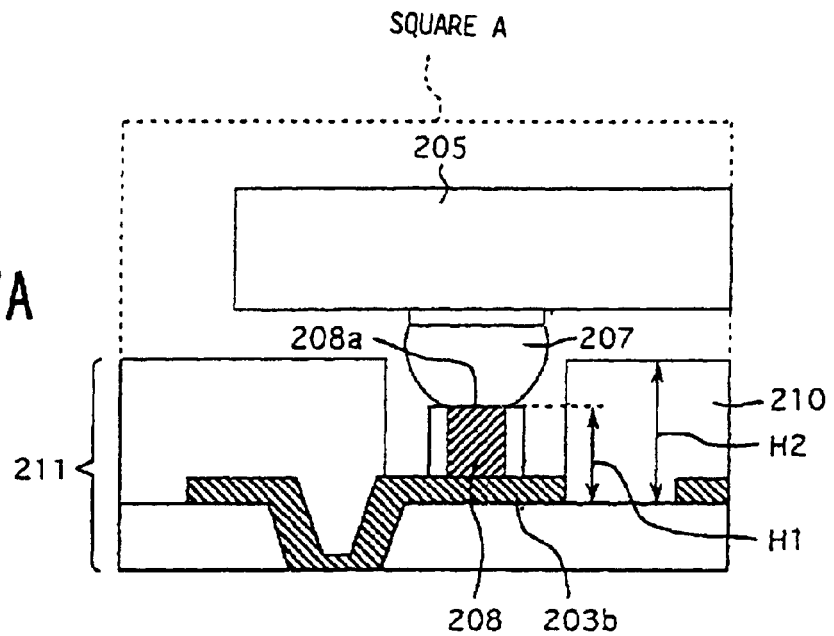
FIG. 7A is an enlarged cross-sectional view of the dotted-lined square A in FIG. 3 after mounting a semiconductor element on the multilayer interconnection substrate with the height of the metal column smaller than the thickness of an insulating layer.

FIG. 7A is an enlarged cross-sectional view of the dotted-lined square A in FIG. 3 after mounting the semiconductor element 205 on the multilayer interconnection substrate 211 with the height H1 of the metal column 208 smaller than the thickness H2 of the insulating layer 210.

As mentioned above, the metal column 208 electrically connects the solder bump 207 and the terminal pad 203b provided for the uppermost interconnection layer 203a. For this purpose, the solder bump 207 has to only adjoin the upper surface 208a of the metal column 208. Accordingly, the height H1 of the metal column 208 may be smaller than the thickness H2 of the insulating layer 210, as long as the upper surface 208a adjoins the solder bump 207.

The inventors of the present invention have discovered that arranging the height of the metal column 208 smaller than the thickness of the insulating layer 210 eases registration of the semiconductor element 205 and the multilayer interconnection substrate 211 when mounting the semiconductor element 205 onto the multilayer interconnection substrate 211. Here, the term "registration of the semiconductor element 205 and the multilayer interconnection substrate 211" means aligning the center of the solder bump 207 formed on the semiconductor element 205 and the center of the corresponding metal column 208.

Figure 7B:
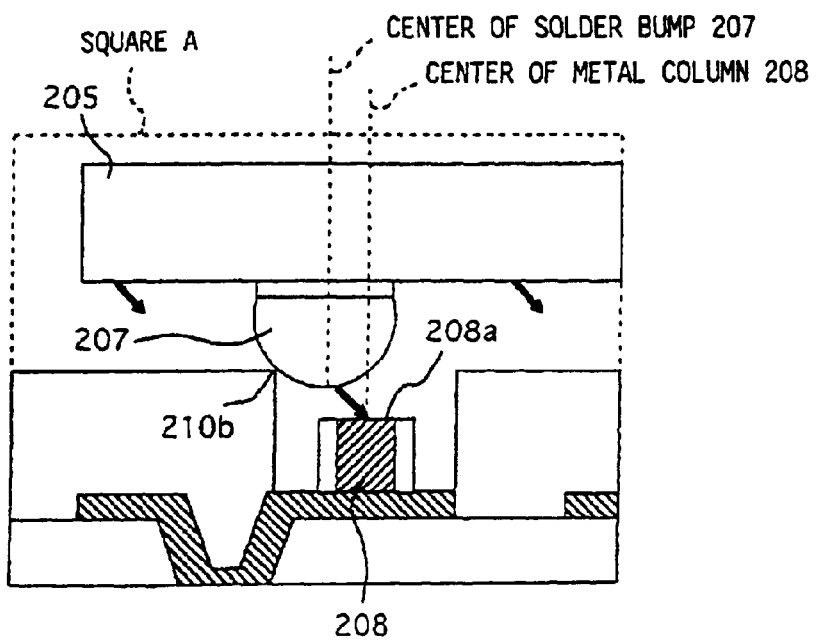
FIG. 7B is an enlarged cross-sectional view of the dotted-lined square A in FIG. 3 in the course of bringing the semiconductor element nearer to the multilayer interconnection substrate with the height of the metal column smaller than the thickness of the insulating layer.

A description will be given, with reference to FIG. 7B, of this point. FIG. 7B is an enlarged cross-sectional view of the dotted-lined square A in FIG. 3 in the course of bringing the semiconductor element 205 nearer to the multilayer interconnection substrate 211 with the height H1 of the metal column 208 smaller than the thickness H2 of the insulating layer 210.

During this course, if the center of the solder bump 207 formed on the semiconductor element 205 and the center of the corresponding metal column 208 are not accurately aligned, the solder bump 207 contacts a periphery 210b of the insulating layer 210, as shown in FIG. 7B.

Then, the whole semiconductor element 205 is automatically guided in a direction indicated by solid-lined arrows in FIG. 7B. Accordingly, the solder bump 207 is guided toward the upper surface 208a of the metal column 208, and eventually, the solder bump 207 adjoins the upper surface 208a of the metal column 208 in a predetermined manner.

Therefore, there is no need to accurately align the center of the solder bump 207 and the center of the corresponding metal column 208 when mounting the semiconductor element 205 onto the multilayer interconnection substrate 211. In other words, arranging the height of the metal column 208 smaller than the thickness of the insulating layer 210 eases registration of the semiconductor element 205 and the multilayer interconnection substrate 211, compared with a case where the height of the metal column 208 is not smaller than the thickness of the insulating layer 210.

Next, a description will be given, with reference to FIG. 8 to FIG. 11, of a manufacturing method of the multilayer interconnection substrate 211 according to the first embodiment of the present invention. FIG. 8 to FIG. 11 are cross-sectional views showing a multilayer interconnection substrate manufacturing method according to a second embodiment of the present invention.

Figure 8:
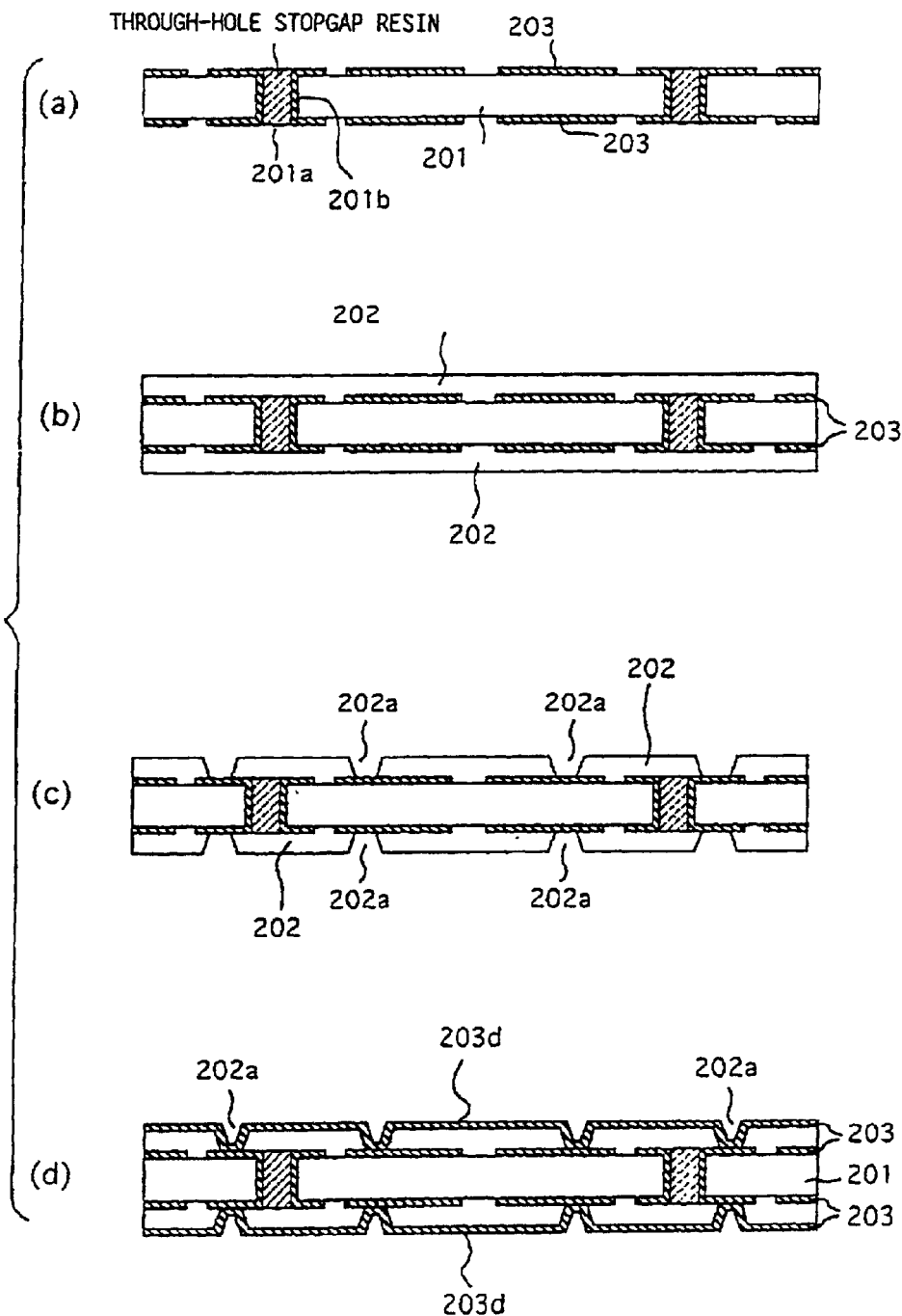
FIG. 8 is a cross-sectional view showing a multilayer interconnection substrate manufacturing method according to a second embodiment of the present invention.

First, as shown in FIG. 8-(A), the core substrate 201, on both surfaces of which are formed the interconnection layers 203, is prepared. This core substrate 201 is such a substrate as a ceramic substrate or a glass epoxy substrate, as described in the first embodiment. The interconnection layers 203 are formed by patterning copper plating films or copper foils provided on the core substrate 201.

The through holes 201a are bored by such tools as a mechanical drill through the core substrate 201 provided with copper plating films or copper foils before the above-mentioned patterning of copper plating films or copper foils. On the inner wall of each of the through holes 201a is formed the through-hole copper plating film 201b. The through-hole copper plating film 201b electrically connects the interconnection layers 203 formed on both surfaces of the core substrate 201. Each of the through holes 201a is filled up with a through-hole stopgap resin.

Next, as shown in FIG. 8-(B), the insulating interlayer 202 is formed on the surface of each of the interconnection layers 203 by applying a resin or adhering a resin sheet. The insulating interlayer 202 is composed of such resins as a photosensitive polyimide resin, a non-photosensitive polyimide resin and an epoxy resin.

Then, as shown in FIG. 8-(C), the via holes 202a are formed through the insulating interlayer 202. When the insulating interlayer 202 is composed of such resins as a non-photosensitive polyimide resin and an epoxy resin, the via holes 202a are bored by projecting a laser on parts of the resin where the via holes 202a are to be formed. When the insulating interlayer 202 is composed of a photosensitive polyimide resin, the via holes 202a are formed by arranging a mask (not shown in the figures) on the insulating interlayer 202, then exposing the insulating interlayer 202 through the mask and developing the insulating interlayer 202.

Then, as shown in FIG. 8-(D), an electroless copper plating film (not shown in the figures) is provided on all surfaces. Thereafter, an electrolytic copper plating film is formed on all surfaces by using the above-mentioned electroless copper plating film as an electric supply layer. Accordingly, the electroless copper plating film and the electrolytic copper plating film together form the interconnection copper plating film 203d.

Figure 9:
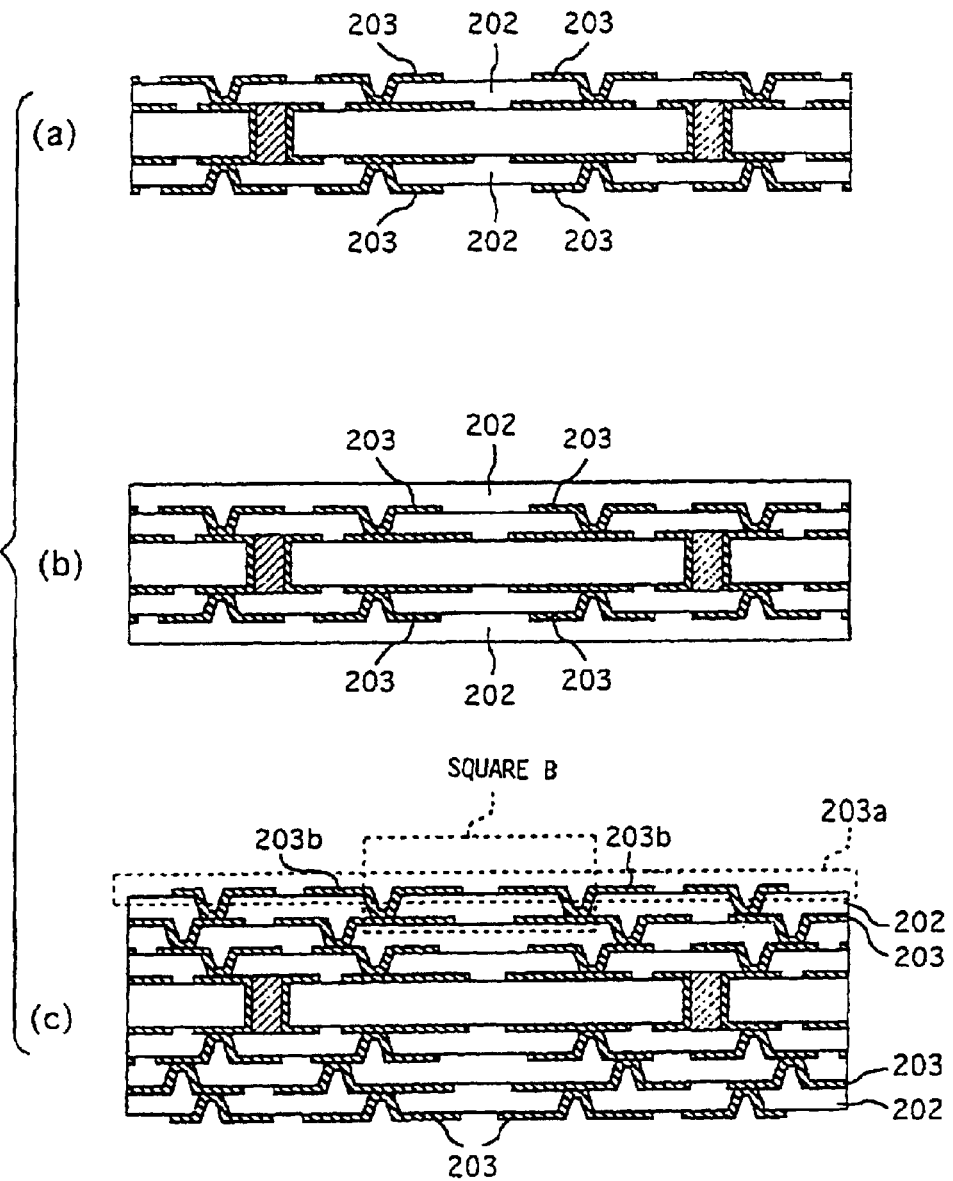
FIG. 9 is a cross-sectional view showing the multilayer interconnection substrate manufacturing method according to the second embodiment of the present invention.

Thereafter, as shown in FIG. 9-(A), the interconnection copper plating film 203d is patterned. This forms the interconnection layer 203 on the insulating interlayer 202.

Next, as shown in FIG. 9-(B), another insulating interlayer 202 is formed on the interconnection layer 203. Hereafter, the steps shown in FIG. 8-(B) to FIG. 9-(A) are repeated a predetermined number of times to form the interconnection layer 203 and the insulating interlayer 202 alternately.

FIG. 9-(C) is a cross-sectional view where six interconnection layers 203 are formed alternately with the insulating interlayers 202. As shown in this figure, the uppermost interconnection layer 203a is formed on top of the alternately formed interconnection layers 203 and insulating interlayers 202. This uppermost interconnection layer 203a has the terminal pads 203b corresponding to each of the solder bumps 207 (shown in FIG. 4) of the semiconductor element 205 to be mounted.

Hereinafter, a description will be given, with reference to enlarged cross-sectional views of a dotted-lined square B in FIG. 9-(C), of steps following FIG. 9-(C).

Figure 10:
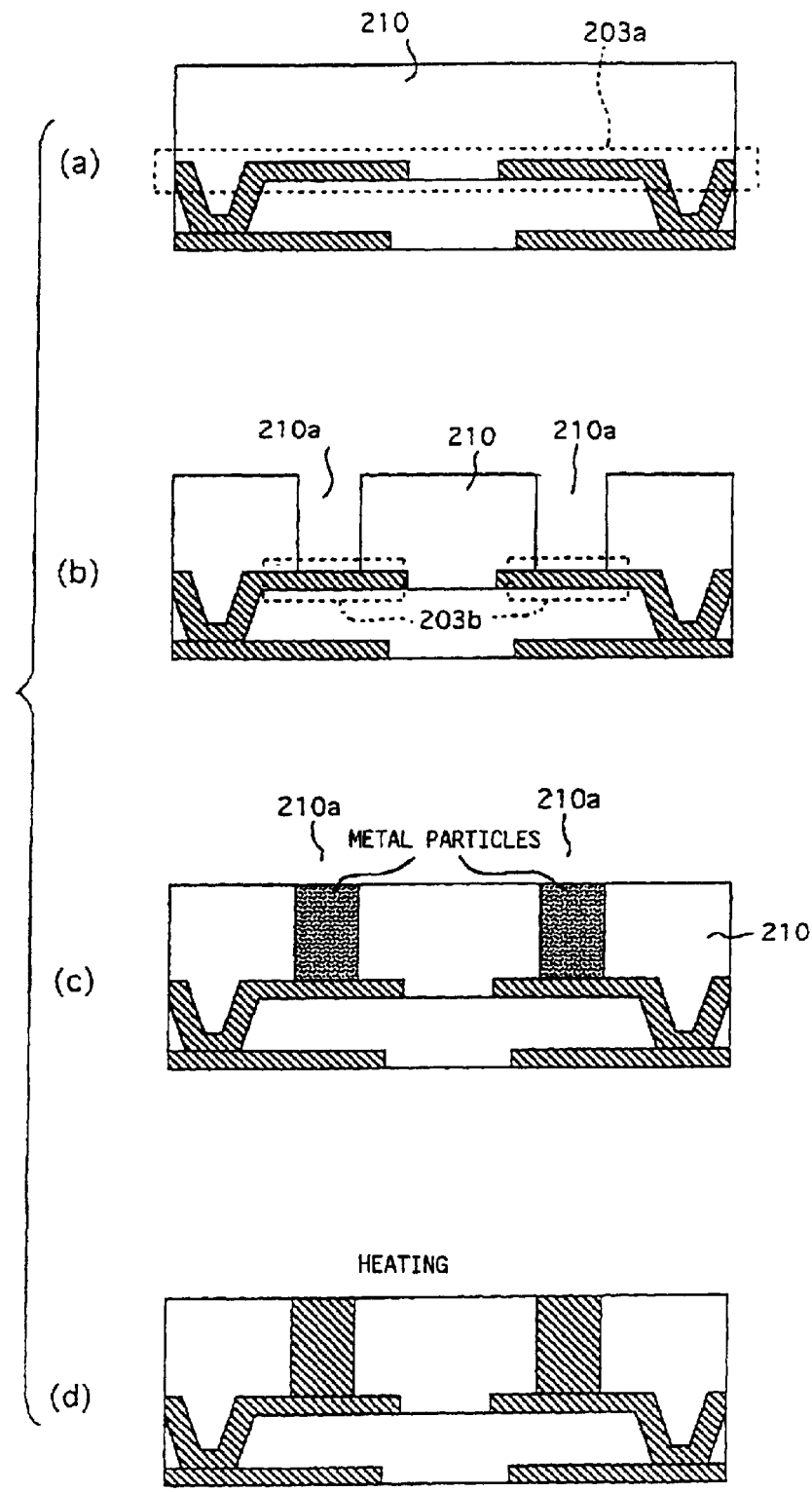
FIG. 10 is a cross-sectional view showing the multilayer interconnection substrate manufacturing method according to the second embodiment of the present invention.

After completion of the step shown in FIG. 9-(C), a step shown in FIG. 10-(A) is performed. In this step, the insulating layer 210 is formed on the uppermost interconnection layer 203a. As described in the first embodiment, the insulating layer 210 is composed of such materials as an epoxy resin, a photosensitive polyimide resin, a non-photosensitive polyimide resin, a bismaleimide triazine resin and a polyphenylene ether resin. The insulating layer 210 is formed by applying these resins or adhering a resin sheet comprising these resins to the surface of the uppermost interconnection layer 203a.

Next, as shown in FIG. 10-(B), the insulating layer 210 is provided with openings 210a corresponding respectively to the terminal pads 203b. When the insulating layer 210 is composed of photosensitive resins such as a photosensitive epoxy resin, the openings 210a are formed by exposing and developing such photosensitive resins. When the insulating layer 210 is composed of non-photosensitive resins, the openings 210a are formed by removing parts of the insulating layer 210 where the openings 210a are to be formed, by projecting a laser or by means of dry etching or wet etching.

Then, as shown in FIG. 10-(C), the openings 210a are filled with solder paste or solder particles (metal particles).

Filling the openings 210a only halfway can provide the metal column 208 lower than the thickness of the insulating layer 210 (shown in FIG. 7A), as described in the first embodiment. The metal column 208 lower than the thickness of the insulating layer 210 eases registration of the semiconductor element 205 and the multilayer interconnection substrate 211, as described in the first embodiment.

The following description is based on a case of completely filling up the openings 210a with metal particles. However, the following description is also applicable to the above-mentioned case of filling the openings 210a only halfway.

Subsequently, as shown in FIG. 10-(D), the whole substrate is heated at a temperature which melts the solder paste or the solder particles filling up the openings 210a. Hence, the melted solder paste or solder particles fill up the openings 210a. Thereafter, the whole substrate is cooled down and the melted solder paste or solder particles solidify. This forms the metal columns 208 comprising the solidified solder paste or solder particles in the openings 210a.

Figure 11:
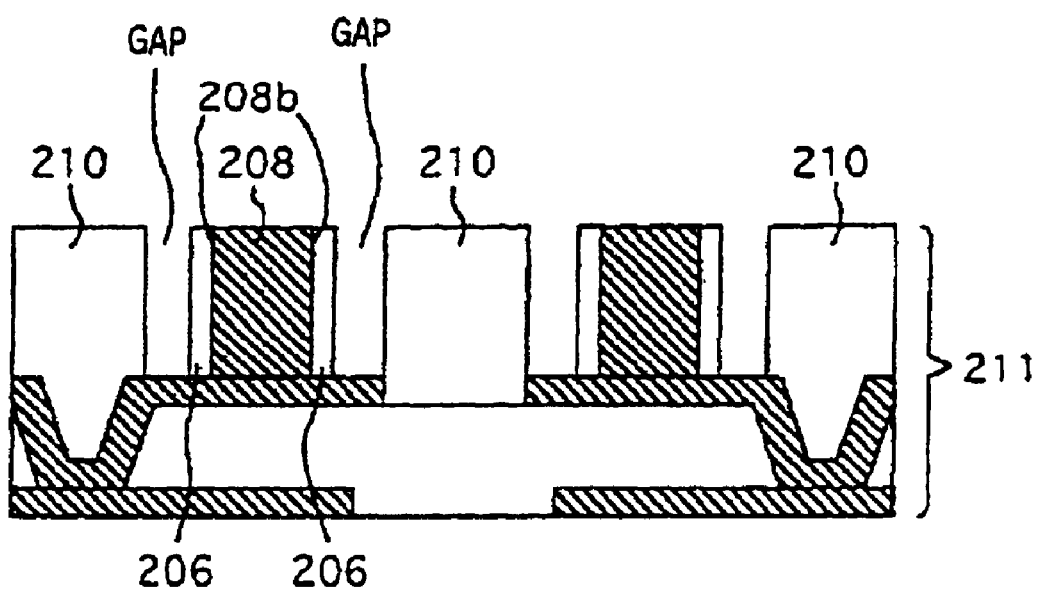
FIG. 11 is a cross-sectional view showing the multilayer interconnection substrate manufacturing method according to the second embodiment of the present invention.

Finally, as shown in FIG. 11, while leaving parts of the insulating layer 210 adjacent to sides 208b of the metal columns 208, parts of the insulating layer 210 near but not adjacent to the sides 208b are removed, to create gaps around but not adjacent to the metal columns 208. The parts of the insulating layer 210 near but not adjacent to the side 208b are removed by projecting such lasers as a UV-YAG laser and an excimer laser thereto or by means of a plasma etching. The parts of the insulating layer 210 adjacent to the sides 208b of the metal columns 208 become the resin films 206 which cover the sides 208b.

The above-mentioned steps complete the multilayer interconnection substrate 211 according to the first embodiment of the present invention. Hereafter, the bottom of the multilayer interconnection substrate 211 is provided with the solder bumps 204 (shown in FIG. 3) which are used to mount the multilayer interconnection substrate 211 on a motherboard (not shown in the figures). Finally, mounting the semiconductor element 205 on the multilayer interconnection substrate 211 by the solder bumps 207 completes a semiconductor package of the BGA (Ball-Grid-Array) type comprising the multilayer interconnection substrate 211 and the semiconductor element 205 (see FIG. 3).

Figure 12:
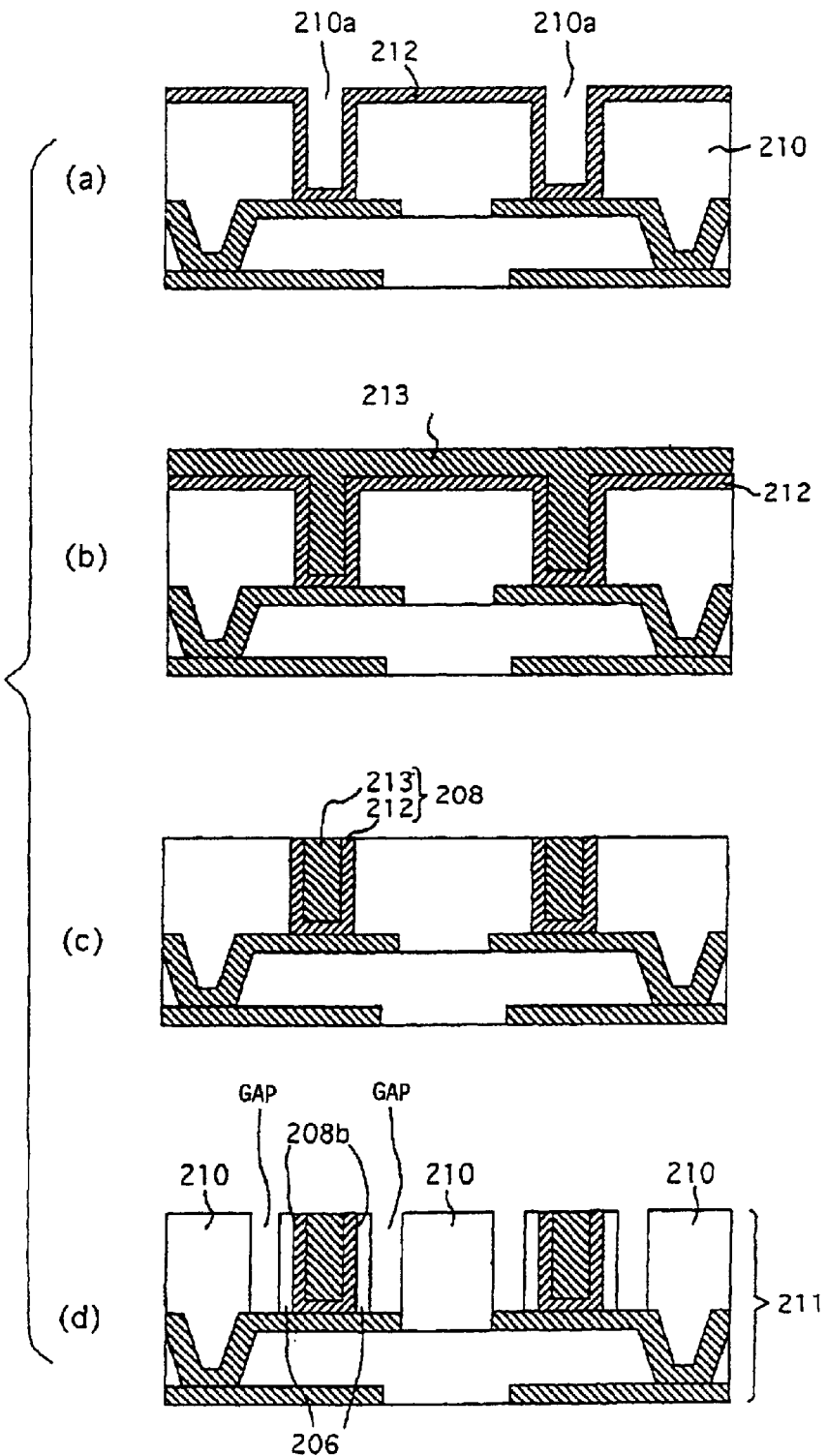
FIG. 12 is a cross-sectional view showing a multilayer interconnection substrate manufacturing method according to a third embodiment of the present invention.

Next, a description will be given, with reference to FIG. 12, of another manufacturing method of the multilayer interconnection substrate 211 according to the first embodiment of the present invention. FIG. 12 is a cross-sectional view showing a multilayer interconnection substrate manufacturing method according to a third embodiment of the present invention.

In the multilayer interconnection substrate manufacturing method according to the third embodiment, the step shown in FIG. 12-(A) is performed, after completion of the step shown in FIG. 10-(B) described in the second embodiment.

In the step shown in FIG. 12-(A), a conductive layer 212 is provided all over the surface by forming an electroless copper plating all over the surface, or by forming a thin copper layer all over the surface by means of evaporation or sputtering.

Next, as shown in FIG. 12-(B), an electrolytic copper plating 213 (plating metal) is formed by using the above-mentioned conductive layer 212 as an electric supply layer, so that the electrolytic copper plating 213 fills up the openings 210a of the insulating layer 210.

Then, as shown in FIG. 12-(C), while leaving the conductive layers 212 and the electrolytic copper plating 213 formed in the openings 210a, the conductive layers 212 and the electrolytic copper plating 213 formed on other parts are removed. This removal is conducted by wet etching or by polishing using the CMP (Chemical Mechanical Polishing) method.

As a consequence, the conductive layers 212 and the electrolytic copper plating 213 are left only in the openings 210a. Thus, in the present embodiment, the conductive layers 212 and the electrolytic copper plating 213 together form the metal columns 208.

Finally, as shown in FIG. 12-(D), while leaving parts of the insulating layer 210 adjacent to sides 208b of the metal columns 208, parts of the insulating layer 210 near but not adjacent to the sides 208b are removed, to create gaps around but not adjacent to the metal columns 208. The parts of the insulating layer 210 near but not adjacent to the side 208b are removed, in the same manner as the second embodiment, by projecting such lasers as a UV-YAG laser and an excimer laser thereto or by means of a plasma etching. The parts of the insulating layer 210 adjacent to the sides 208b of the metal columns 208 become the resin films 206 which cover the sides 208b.

The above-mentioned steps complete the multilayer interconnection substrate 211 according to the first embodiment of the present invention. Hereafter, the bottom of the multilayer interconnection substrate 211 is provided with the solder resist 209 and the solder bumps 204, as shown in FIG. 3. Finally, mounting the semiconductor element 205 on the multilayer interconnection substrate 211 via the solder bumps 207 completes a semiconductor package of the BGA (Ball-Grid-Array) type comprising the multilayer interconnection substrate 211 and the semiconductor element 205 (see FIG. 3).

Figure 13:
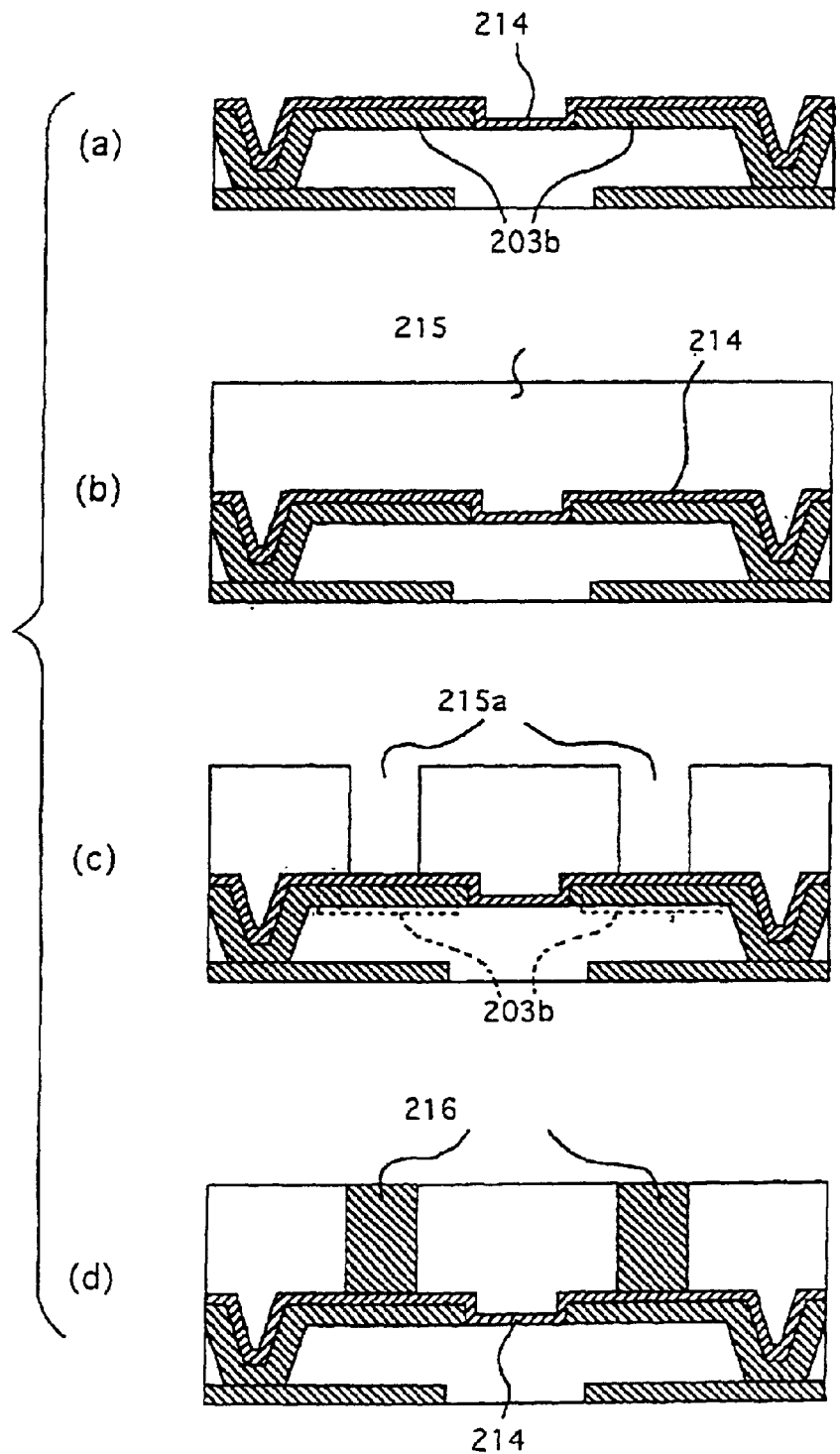
FIG. 13 is a cross-sectional view showing a multilayer interconnection substrate manufacturing method according to a fourth embodiment of the present invention.
Figure 14:
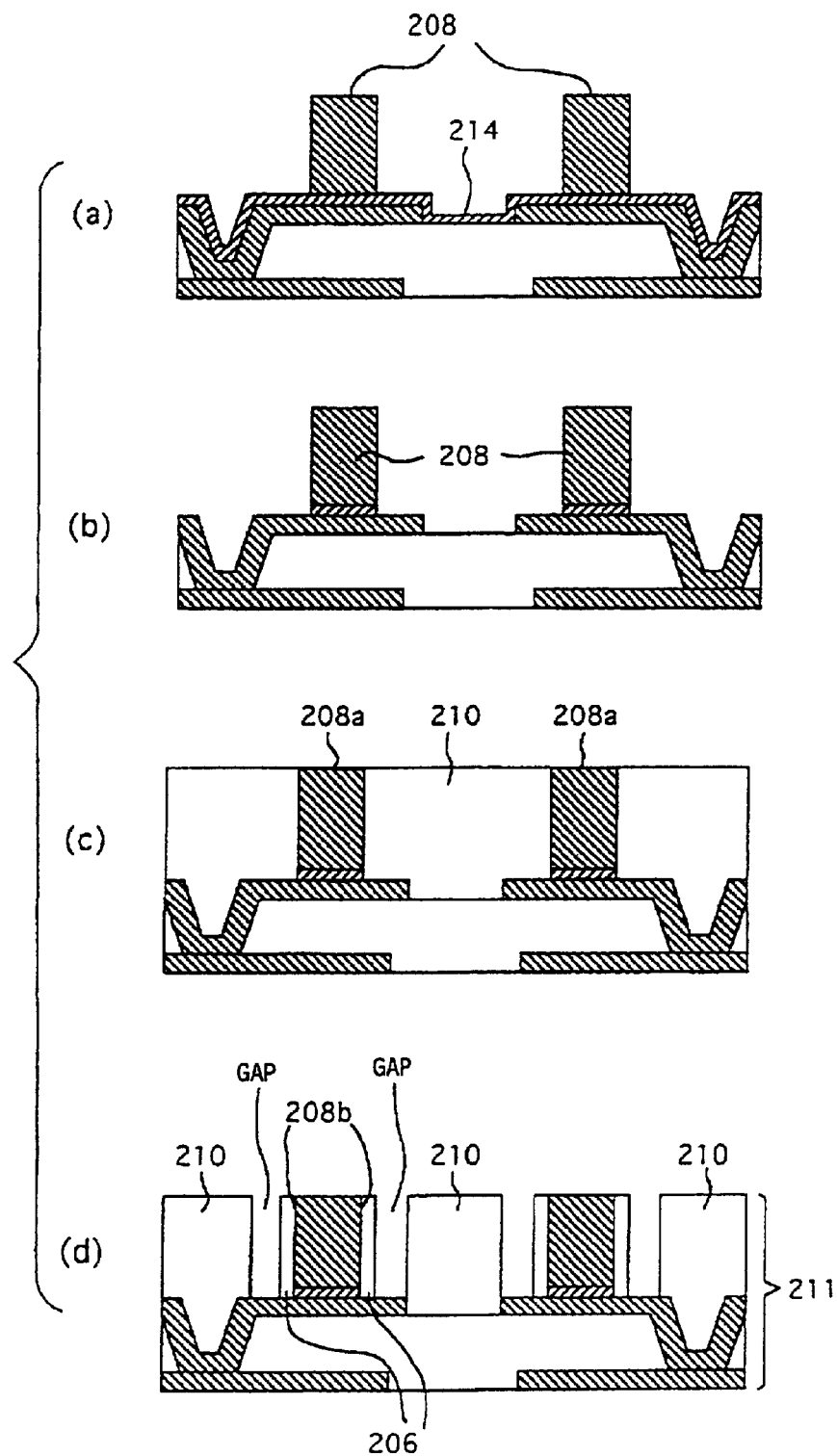
FIG. 14 is a cross-sectional view showing the multilayer interconnection substrate manufacturing method according to the fourth embodiment of the present invention.

Next, a description will be given, with reference to FIG. 13 and FIG. 14, of still another manufacturing method of the multilayer interconnection substrate 211 according to the first embodiment of the present invention. FIG. 13 and FIG. 14 are cross-sectional views showing a multilayer interconnection substrate manufacturing method according to a fourth embodiment of the present invention.

In the multilayer interconnection substrate manufacturing method according to the fourth embodiment, the step shown in FIG. 13-(A) is performed, after completion of the step shown in FIG. 9-(C) described in the second embodiment.

Hereinafter, a description will be given, with reference to enlarged cross-sectional views of the dotted-lined square B in FIG. 9-(C), of steps following FIG. 13-(A).

In the step shown in FIG. 13-(A), a conductive layer 214 is formed all over the surface by electroless copper plating, or by sputtering copper.

Then, as shown in FIG. 13-(B), a plating resist 215 is formed on the conductive layer 214.

Next, as shown in FIG. 13-(C), the plating resist 215 is provided with openings 215a corresponding respectively to the terminal pads 203b formed in the uppermost interconnection layer 203a. This exposes parts of the conductive layer 214 corresponding to the terminal pads 203b at the bottom of the openings 215a.

Next, as shown in FIG. 13-(D), plating metals 216, such as a copper plating and a solder plating, are formed on the parts of the conductive layer 214 exposed at the bottom of the openings 215a, by electrolytic plating, using the conductive layer 214 as an electric supply layer. As a consequence, the plating metals 216 have the same shape as the openings 215a. Thus, in the present embodiment, the plating metals 216 form the metal columns 208.

Then, as shown in FIG. 14-(A), the plating resist 215 is removed. This exposes parts of the conductive layer 214 other than where the metal columns 208 are formed.

Subsequently, as shown in FIG. 14-(B), the exposed parts of the conductive layer 214 are removed by wet etching or dry etching. In doing this, arranging the thickness of the conductive layer 214 considerably small compared to the thickness of the terminal pads 203b and the diameter of the metal columns 208, prevents the etching from removing the metal columns 208.

It is preferred that, when the plating metals 216 forming the metal columns 208 (see the step shown in FIG. 13-(D)) are a solder plating, such an etching solution as a hydrogen peroxide/sulfuric acid etching solution or an alkali etchant be used. These etching solutions dissolve copper but not solder. In other words, the etching rate of these etching solutions with respect to copper is higher than with respect to solder. This allows for selective removal by etching of the parts of the conductive layer 214 other than where the metal columns 208 are formed.

Then, as shown in FIG. 14-(C), the insulating layer 210 is formed all over the surface, leaving the upper surfaces 208a of the metal columns 208 uncovered. The insulating layer 210 is, as described in the first embodiment, composed of such materials as an epoxy resin, a photosensitive polyimide resin, a non-photosensitive polyimide resin, a bismaleimide triazine resin and a polyphenylene ether resin.

Finally, as shown in FIG. 14-(D), while leaving parts of the insulating layer 210 adjacent to sides 208b of the metal columns 208, parts of the insulating layer 210 near but not adjacent to the sides 208b are removed, to create gaps around but not adjacent to the metal columns 208. The parts of the insulating layer 210 near but not adjacent to the side 208b are removed, in the same manner as the second and the third embodiments, by projecting such lasers as a UV-YAG laser and an excimer laser thereto or by means of a plasma etching. When the insulating layer 210 is composed of photosensitive resins, the above-mentioned gaps are formed by exposing and developing the above-mentioned parts of the insulating layer 210 near but not adjacent to the sides 208b. The parts of the insulating layer 210 adjacent to the sides 208b of the metal columns 208 become the resin films 206 which cover the sides 208b.

The above-mentioned steps complete the multilayer interconnection substrate 211 according to the first embodiment of the present invention. Hereafter, the bottom of the multilayer interconnection substrate 211 is provided with the solder resist 209 and the solder bumps 204, as shown in FIG. 3. Finally, mounting the semiconductor element 205 on the multilayer interconnection substrate 211 via the solder bumps 207 completes a semiconductor package of the BGA (Ball-Grid-Array) type comprising the multilayer interconnection substrate 211 and the semiconductor element 205 (see FIG. 3).

Figure 15:
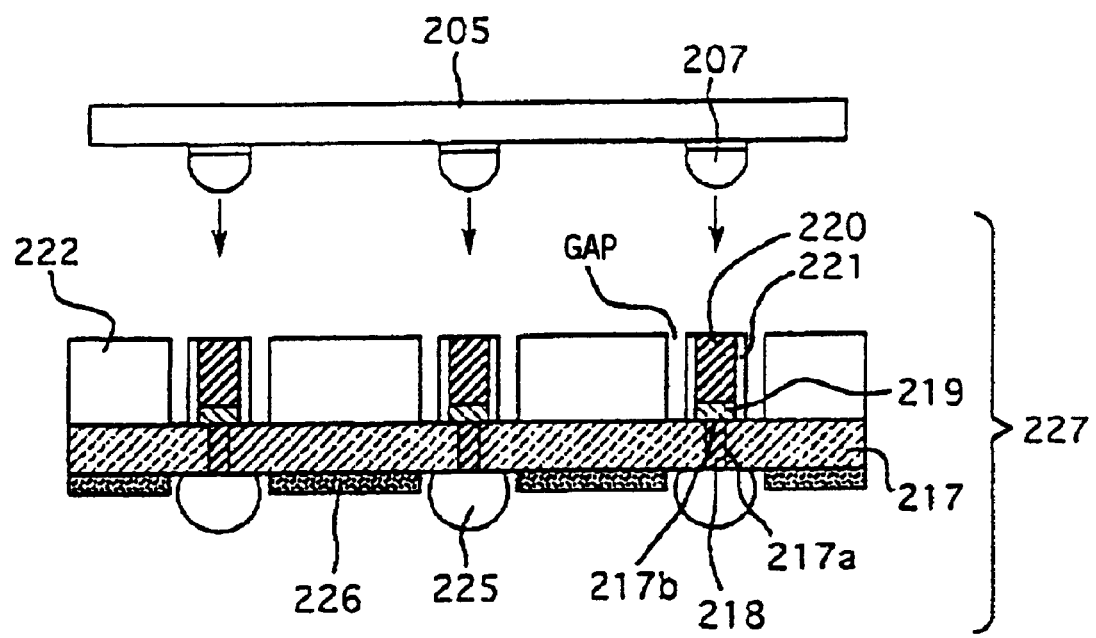
FIG. 15 is a cross-sectional view of an interconnection substrate according to a fifth embodiment of the present invention.

Next, a description will be given, with reference to FIG. 15, of an interconnection substrate according to a fifth embodiment of the present invention. FIG. 15 is a cross-sectional view of a interconnection substrate 227 according to the fifth embodiment of the present invention.

FIG. 15 shows an insulating base 217 composed of such substrates as a ceramic substrate and a glass epoxy substrate. This insulating base 217 has via holes 217a (penetration holes) corresponding respectively to the solder bumps 207 (external connection terminals) provided on the semiconductor element 205 to be mounted on the interconnection substrate 227. Plating metals 218, such as a copper plating and a solder plating, fill up the via holes 217a.

This insulating base 217 also has, on one of its surfaces, terminal pads 219 corresponding respectively to the via holes 217a. The terminal pads 219 are formed on one of opening ends 217b of each of the via holes 217a. Since the via holes 217a are, as mentioned above, formed correspondingly to the solder bumps 207, the terminal pads 219, as a consequence, correspond to the solder bumps 207.

On each of the terminal pads 219 is formed a metal column 220 which electrically connects the terminal pad 219 and the corresponding solder bump 207. The metal columns 220 are covered respectively with resin films 221 on the side.

An insulating layer 222 is formed on the above-mentioned surface of the insulating base 217 with a gap to the outer peripheral surface of each of the resin films 221. The interconnection substrate 227 according to the fifth embodiment of the present invention comprises the insulating base 217, the metal columns 220 covered respectively with the resin films 221 on the side, the insulating layer 222, the via holes 217a filled up with the plating metals 218 and the terminal pads 219.

Solder bumps 225 are used for mounting the interconnection substrate 227 on a motherboard (not shown in the figures). Mounting the interconnection substrate 227 on the motherboard and reflowing the solder bumps 225 electrically and mechanically connects the interconnection substrate 227 and the motherboard. When reflowing the solder bumps 225, a solder resist 226 prevents the melted solder from spreading beyond predetermined parts on the surface of the interconnection substrate 227.

Further, mounting the semiconductor element 205 on the interconnection substrate 227 with the solder bumps 207 on the corresponding metal columns 220 and then reflowing the solder bumps 207 electrically and mechanically connects the interconnection substrate 227 and the semiconductor element 205. The interconnection substrate 211 and the semiconductor element 205 mounted thereon make a semiconductor package of the BGA type.

It should be noted that the present invention is not only applicable to the semiconductor package of the BGA type but also provides the same functions and effects as described below for a semiconductor package of the PGA type having pins in place of the solder bumps 225.

In the present embodiment, the metal columns 220 have the same function as the metal columns 208 described in the first embodiment. That is, the metal columns 220 not only electrically connect the interconnection substrate 227 and semiconductor element 205, but also relax the stress, as described in the first embodiment, which acts therebetween.

Additionally, as in the first embodiment, the metal columns 220 are formed not on the semiconductor element 205, as is the case for conventional columns, but on the interconnection substrate 227. Therefore, a post-process of manufacturing the semiconductor element 205 does not need to be prolonged to form metal columns. This reduces the possibility of the semiconductor element 205 falling inferior in the post-process, compared with the conventional columns formed on a semiconductor element.

Since the metal columns 220 are covered with the resin films 221 respectively, when reflowing the solder bumps 207, the melted solder does not flow down the outer peripheral surfaces of the resin films 221. This respect was detailed in describing the first embodiment.

Additionally, the insulating layer 222 surrounds the metal columns 220 with the gaps in between, and thus prevents an external force in a horizontal direction from directly pressing the metal columns 220. Therefore, the metal columns 220 are kept from coming off by being pressed by the external force in a horizontal direction. This respect was also detailed in describing the first embodiment.

Figure 16:
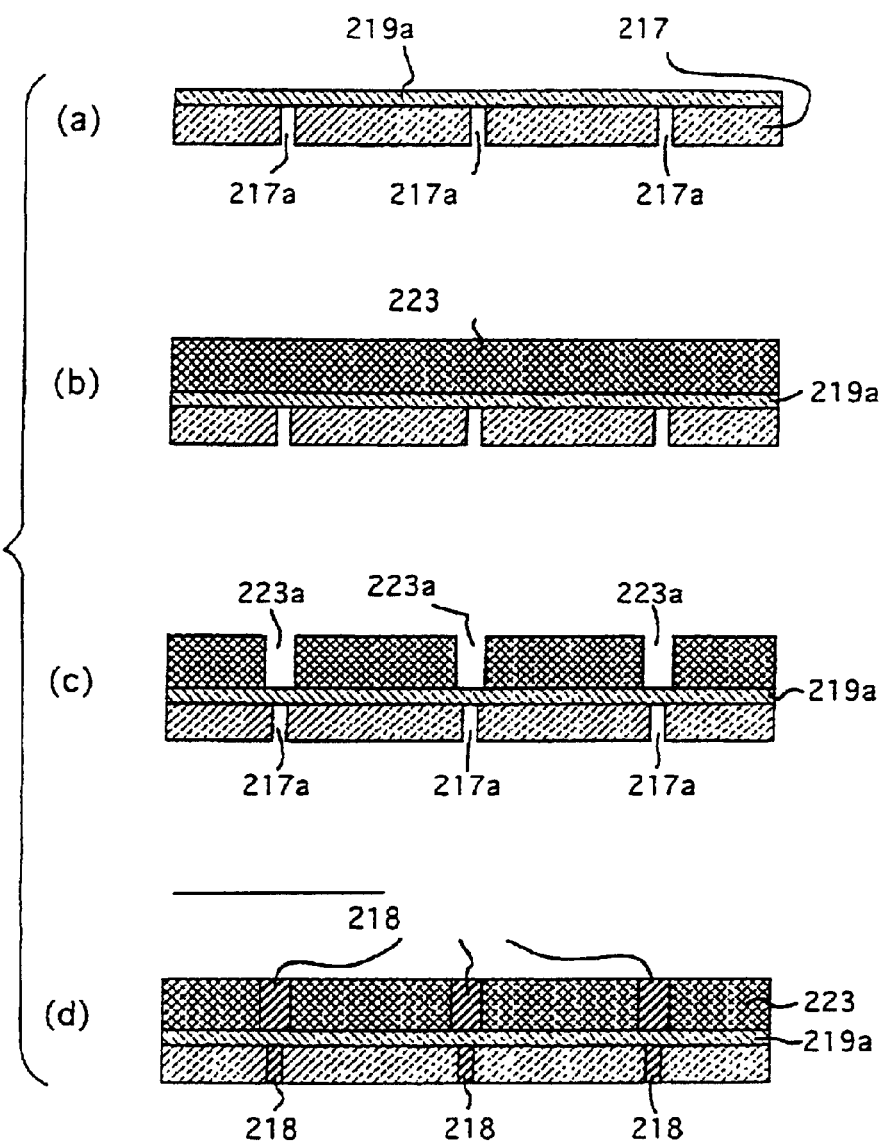
FIG. 16 is a cross-sectional view showing a manufacturing method of the interconnection substrate according to the fifth embodiment of the present invention.
Figure 17:
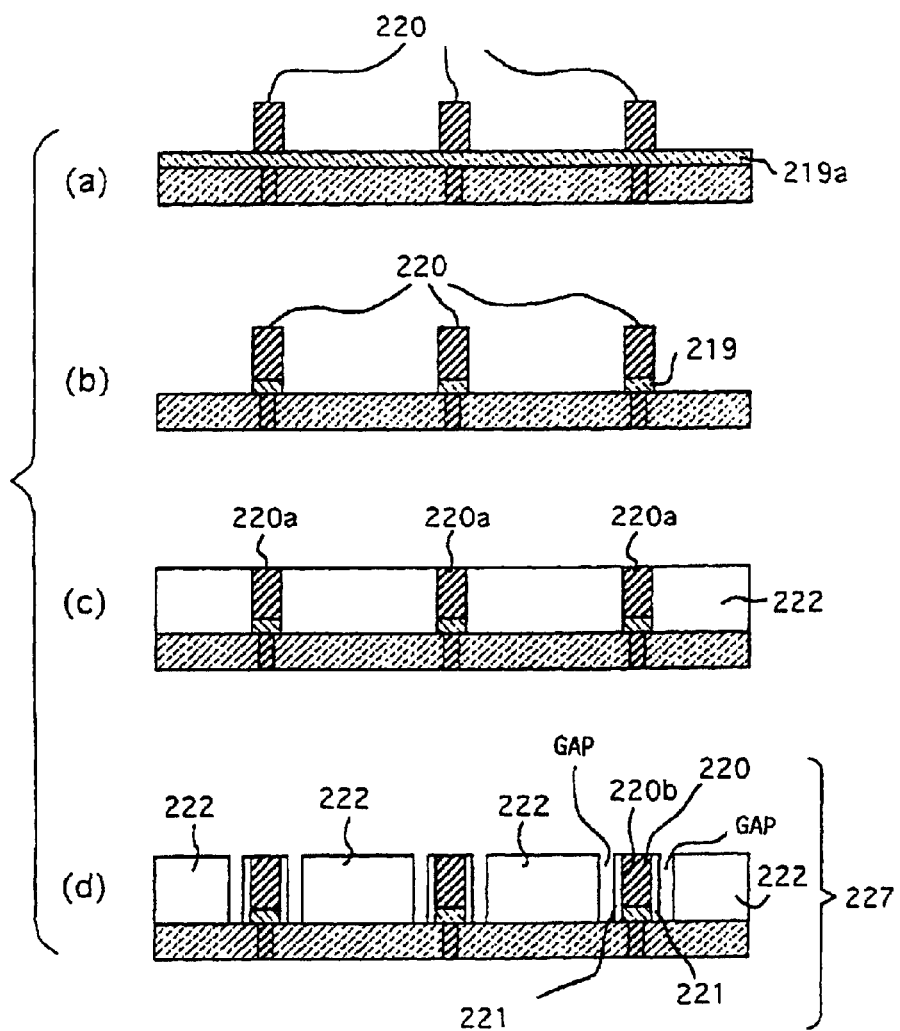
FIG. 17 is a cross-sectional view showing the manufacturing method of the interconnection substrate according to the fifth embodiment of the present invention.

Next, a description will be given, with reference to FIG. 16 and FIG. 17, of a manufacturing method of the interconnection substrate according to the fifth embodiment of the present invention. FIG. 16 and FIG. 17 are cross-sectional views showing the manufacturing method of the interconnection substrate according to the fifth embodiment of the present invention.

First, as shown in FIG. 16-(A), the insulating base 217 having the via holes 217a (penetration holes) and, on one of its surfaces, a copper foil 219a (a conductive layer for the terminal pads 219) is prepared. The via holes 217a respectively correspond to the solder bumps 207 (external connection terminals) shown in FIG. 15.

Then, as shown in FIG. 16-(B), a plating resist 223 is provided on the copper foil 219a.

Next, as shown in FIG. 16-(C), openings 223a, corresponding to the via holes 217a, are formed in the plating resist 223. This exposes the parts of the copper foil 219a corresponding to the via holes 217a at the bottom of the openings 223a.

Subsequently, as shown in FIG. 16-(D), the via holes 217a and the openings 223a are filled up with the plating metals 218, such as a copper plating and a solder plating, by electrolytic plating, using the copper foil 219a as an electric supply layer. Here, the metal plating 218 which fills up the openings 223a becomes the metal columns 220.

Then, as shown in FIG. 17-(A), the plating resist 223 is removed, exposing parts of the copper foil 219a other than where the metal columns 220 are formed.

Subsequently, as shown in FIG. 17-(B), the exposed parts of the copper foil 219a are removed by immersing the whole substrate into an etching solution and etching the exposed parts. In doing this, if the plating metals 218 forming the metal columns 220 (see the step shown in FIG. 16-(D)) are a solder plating, such an etching solution as a hydrogen peroxide/sulfuric acid etching solution or an alkali etchant is used. These etching solutions dissolve copper but not solder. In other words, the etching rate of these etching solutions with respect to copper is higher than with respect to solder. This allows for selective removal by etching of the parts of the copper foil 219a other than where the metal columns 220 are formed.

This etching leaves parts of the copper foil 219a where the metal columns 220 are formed. The parts left of the copper foil 219a become the terminal pads 219 which respectively correspond to the solder bumps 207 (external connection terminals) shown in FIG. 15.

Then, as shown in FIG. 17-(C), the insulating layer 222 is formed all over the surface, leaving upper surfaces 220a of the metal column 220 uncovered. The insulating layer 222 is composed of such materials as an epoxy resin, a photosensitive polyimide resin, a non-photosensitive polyimide resin, a bismaleimide triazine resin and a polyphenylene ether resin.

Finally, as shown in FIG. 17-(D), while leaving parts of the insulating layer 222 adjacent to sides 220b of the metal columns 220, parts of the insulating layer 222 near but not adjacent to the sides 220b are removed, to create gaps around but not adjacent to the metal columns 220. The parts of the insulating layer 222 near but not adjacent to the side 220b are removed, in the same manner as the second, the third and the fourth embodiments, by projecting such lasers as a UV-YAG laser and an excimer laser thereto or by means of a plasma etching. When the insulating layer 222 is composed of photosensitive resins, the above-mentioned gaps are formed by exposing and developing the above-mentioned parts of the insulating layer 222 near but not adjacent to the sides 220b. The parts of the insulating layer 222 adjacent to the sides 220b of the metal columns 220 become the resin films 221 which cover the sides 220b.

The above-mentioned steps complete the interconnection substrate 227 according to the fifth embodiment of the present invention. Hereafter, the bottom of the interconnection substrate 227 is provided with the solder resist 226 and the solder bumps 225, as shown in FIG. 15. Finally, mounting the semiconductor element 205 on the interconnection substrate 227 via the solder bumps 207 completes a semiconductor package of the BGA type comprising the interconnection substrate 227 and the semiconductor element 205.

The above-mentioned manufacturing method of the interconnection substrate 227 may be replaced by the following manufacturing method of the interconnection substrate 227.

After the step shown in FIG. 16-(A), a resist (not shown in the figures) is provided on the upper surface of the copper foil 219a.

Next, the via holes 217a are filled up with the plating metals 218, such as a copper plating and a solder plating, by electrolytic plating, using the copper foil 219a as an electric supply layer. Here, the plating metal 218 is not formed on the upper surface of the copper foil 219a on which the resist is provided.

Then, the resist is removed from the upper surface of the copper foil 219a. Thereafter, the plating resist 223 is provided on the copper foil 219a.

Next, the openings 223a, corresponding to the via holes 217a, are formed in the plating resist 223.

Subsequently, the openings 223a are filled up with the plating metals 218, such as a copper plating and a solder plating, by electrolytic plating, using the copper foil 219a as an electric supply layer. Hereafter, the steps shown in FIG. 17 are performed.

The heretofore-mentioned manufacturing method of the interconnection substrate 227 allows for use of different materials respectively for the metal columns 220 and the plating metals 218 filling up the via holes 217a. That is, in one case, the metal columns 220 may be composed of solder plating while the plating metals 218 may be composed of copper plating. In another case, to the contrary, the metal columns 220 may be composed of copper plating while the plating metals 218 may be composed of solder plating.

The present invention is not limited to the specifically disclosed embodiments, and variations and modifications may be made without departing from the scope of the present invention.

The present application is based on Japanese priority application No. 2000-004873 filed on Jan. 13, 2000, the entire contents of which are hereby incorporated by reference.

What is claimed is:

1. A multilayer interconnection substrate comprising:
an uppermost interconnection layer having a plurality of terminal pads formed at positions corresponding to a plurality of external connection terminals provided on a semiconductor element which is to be mounted on said multilayer interconnection substrate;

a metal column formed on each of said terminal pads by metal-plating, and having a top surface;

a resin film covering a side surface of said metal column, and having a top surface; and an insulating layer formed on said uppermost interconnection layer of the same material as the resin film so that a gap is formed between the insulating layer and an outer peripheral surface of said resin film, wherein an upper end surface of each metal column is at the same height as an upper surface of the insulating layer, the top surface of the metal column and the top surface of the resin film covering the side surface of the metal column are formed at the same level of height; and the top surface of the metal column is surrounded by and exposed on the resin film so that the top surface of the resin film metal column forms a pad for connection with a semi-conductor element.

2. A semiconductor device comprising:

a multilayer interconnection substrate which comprises an uppermost interconnection layer having a plurality of terminal pads formed at positions corresponding to a plurality of external connection terminals provided on a semiconductor element which is to be mounted on said multilayer interconnection substrate; a metal column formed by metal-plating on each of said terminal pads and having a top surface; a resin film covering a side surface of said metal column and having a top surface; and an insulating layer formed on said uppermost interconnection layer of the same material as the resin film so that a gap is formed between the insulating layer and an outer peripheral surface of said resin film, wherein an upper end surface of each metal column is at the same height as an upper surface of the insulating layer, the top surface of the metal column and the top surface of the resin film covering the side surface of the metal column are formed at the same level of height; and the top surface of the metal column is surrounded by and exposed on the resin film so that the top surface of the metal column forms a pad for connection with a semi-conductor element.

3. A semiconductor device comprising:

a multilayer interconnection substrate manufactured by forming a plurality of terminal pads in an uppermost interconnection layer; forming an insulating layer on said uppermost interconnection layer; forming openings in said insulating layer, the openings located at positions corresponding to said terminal pads; filling each of said openings with metal particles; forming a metal column in each of said openings by heating said metal particles at a temperature which melts said metal particles so as to define a metal column top surface; and removing a part of said insulating layer near but not adjacent to a peripheral side of said metal column, while leaving a part of said insulating layer adjacent to said peripheral side of said metal column, so that a gap is formed around but not adjacent to said peripheral side of said metal column, wherein the top surface of each metal column is at the same height as an upper surface of the insulating layer.

* * * * *